(12) United States Patent
Tinnemans

(10) Patent No.: US 10,241,426 B2
(45) Date of Patent: Mar. 26, 2019

(54) LITHOGRAPHIC APPARATUS AND DEVICE MANUFACTURING METHOD

(71) Applicant: ASML NETHERLANDS B.V., Veldhoven (NL)

(72) Inventor: Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/749,209

(22) PCT Filed: Jul. 27, 2016

(86) PCT No.: PCT/EP2016/067867
§ 371 (c)(1),
(2) Date: Jan. 31, 2018

(87) PCT Pub. No.: WO2017/032534
PCT Pub. Date: Mar. 2, 2017

(65) Prior Publication Data
US 2018/0231900 A1    Aug. 16, 2018

(30) Foreign Application Priority Data
Aug. 27, 2015    (EP) .................................... 15182697

(51) Int. Cl.
*G03F 7/20*    (2006.01)
*G03F 9/00*    (2006.01)

(52) U.S. Cl.
CPC ........ *G03F 9/7046* (2013.01); *G03F 7/70633* (2013.01); *G03F 7/70691* (2013.01); *G03F 9/7019* (2013.01); *G03F 9/7023* (2013.01); *G03F 9/7088* (2013.01)

(58) Field of Classification Search
CPC .. G03F 9/7019; G03F 9/7046; G03F 7/70633; G03F 7/70691; G03F 9/7023; G03F 9/7088
See application file for complete search history.

(56) References Cited

U.S. PATENT DOCUMENTS

| 9,046,385 B2 | 6/2015 | Bijnen et al. |
| 2005/0128489 A1* | 6/2005 | Bao .................. G01B 11/24 356/601 |

(Continued)

FOREIGN PATENT DOCUMENTS

| TW | 201241783 | 10/2012 |
| TW | 201531817 | 8/2015 |
| WO | 2015/082158 | 6/2015 |

OTHER PUBLICATIONS

International Search Report and Written Opinion dated Feb. 27, 2017 in corresponding International Patent Application No. PCT/EP2016/067867.

*Primary Examiner* — Steven Whitesell Gordon
(74) *Attorney, Agent, or Firm* — Pillsbury Winthrop Shaw Pittman LLP

(57) ABSTRACT

An initialization method including estimating a characteristic of a property of an object based on a plurality of measurements by the sensor of the property using a respective plurality of different measurement parameters, different ones of the measurements using different measurement parameters, the characteristic including a combination of respective outcomes of respective ones of the measurements weighted by a respective weighting coefficient; performing, for each of a plurality of models of the object, each model configured to enable respective simulation of the performing of the measurements, a respective simulation, the respective simulation including simulating the measurements under control of a respective plurality of different simulation parameters to obtain a respective plurality of simulated characteristics of the property, the different simulation parameters being indicative of the different measurement parameters; determining, for each of the models, a respective bias representative of a respective difference between a respective theoretical characteristic of the property in accordance with the respective model and a respective further combination of the simulated characteristics of the property (Continued)

in the respective model, the respective further combination of the simulated characteristics including the weight coefficients, each particular one of the weight coefficients associated with a particular one of the different simulation parameters; using a cost function configured to optimize a correspondence between the simulated characteristic of the property and the theoretical characteristic of the property, the cost function being a function of the respective biases of the models; and optimizing the cost function to derive the weight coefficients from the cost function; and using the weight coefficients and the associated simulation parameters in a controller associated with the sensor.

20 Claims, 7 Drawing Sheets

(56) References Cited

U.S. PATENT DOCUMENTS

| | | | |
|---|---|---|---|
| 2010/0175033 A1 | 7/2010 | Adel et al. | |
| 2010/0280801 A1* | 11/2010 | Deschrijver | G06F 17/5036 703/2 |
| 2012/0123748 A1* | 5/2012 | Aben | G03F 7/70483 703/2 |
| 2014/0136164 A1* | 5/2014 | Bringoltz | G06F 17/5018 703/2 |
| 2015/0186582 A1 | 7/2015 | Chen et al. | |
| 2016/0334715 A1 | 11/2016 | Smilde et al. | |

* cited by examiner (a)

(b)

(c)

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/067867, which was filed on Jul. 27, 2016, which claims priority of European Patent EP application no. 15182697.1, which was filed on Aug. 27, 2015, and which is incorporated herein in its entirety by reference.

BACKGROUND

Field of the Invention

The present invention relates to an initialization method for a sensor, a metrology sensor such as an alignment sensor, an overlay sensor or a level sensor, a metrology measurement method such as an alignment method, a lithographic apparatus, and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, the integrated circuits as manufactured include a plurality of layers containing different patterns, each layer being generated using an exposure process as described above. In order to ensure proper operation of the integrated circuit that is manufactures, the layers as consecutively exposed need to be properly aligned to each other. In order to realize this, substrates are typically provided with a plurality of so-called alignment marks (also referred to as alignment targets), whereby a position of the alignment marks is used to determine or estimate a position of a previously exposed pattern. As such, prior to the exposure of a subsequent layer, the position of alignment marks is determined and used to determine a position of the pattern that was previously exposed. Typically, in order to determine the positions of such alignment marks, an alignment sensor is applied which may e.g. be configured to project a radiation beam onto an alignment mark or target and determine, based on a reflected radiation beam, a position of the alignment mark.

Ideally, the measured position of the alignment mark would correspond to the actual position of the mark. However, various causes may result in a deviation between the measured position and the actual position of the alignment mark. In particular, a deformation of the alignment mark may result in the mentioned deviation. Such a deformation may e.g. be caused by the processing of the substrate outside the lithographic apparatus, such processing e.g. including etching and chemical mechanical polishing.

As a result, the subsequent layer may be projected or exposed on a position which is not in line, i.e. not aligned, with the previously exposed pattern, resulting in a so-called overlay error.

Note that other sensors as typically applied in a lithographic apparatus or as applied to assess lithographic processes as performed by a lithographic apparatus, e.g. metrology sensors, may suffer from similar problems. Examples of such sensors include overlay sensors and level sensors.

SUMMARY

It is desirable to provide in an improved measurement method for measuring a property of an object, in particular a substrate or a patterning device. Such a measurement method is e.g. performed by a metrology sensor such as an alignment sensor, an overlay sensor or a level sensor.

In an embodiment, a measurement method for measuring a position of alignment marks on a substrate enabling a more accurate determination of an actual position of an alignment mark can be mentioned. In a first aspect of the present invention, an initialization method for a sensor, in particular a metrology sensor, is provided, the sensor being configured to perform a plurality of measurements of a property of an object using a respective plurality of different measurement parameters, different ones of the plurality of measurements using different measurement parameters, the method comprising:

estimating a characteristic of the property based on the plurality of measurements, the characteristic comprising a combination of respective outcomes of respective ones of the plurality of measurements weighted by a respective weighting coefficient;

using a plurality of models of the object, each respective one of the models being configured to enable a respective simulation of the performing of the plurality of measurements;

performing, for each of respective one of the plurality of models, a respective simulation, the respective simulation including simulating the plurality of measurements under control of a respective plurality of different simulation parameters to obtain a respective plurality of simulated characteristics of the property, the plurality of different simulation parameters being indicative of the plurality of different measurement parameters;

determining, for each respective one of the plurality of models, a respective bias representative of a respective difference between a respective theoretical characteristic of the property in accordance with the respective model and a respective further combination of the simulated characteristics of the property in the respective model; the respective further combination of the simulated characteristics comprising the plurality of weight coefficients, each particular one of the plurality of weight coefficients being associated with a particular one of the plurality of different simulation parameters;

using a cost function configured to optimize a correspondence between the simulated characteristic of the property and the theoretical characteristic of the property; the cost function being a function of the respective biases of the plurality of models;

optimizing the cost function, thereby deriving the plurality of the weight coefficients from the cost function;

using the weight coefficients and the associated simulation parameters in a controller associated with the sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
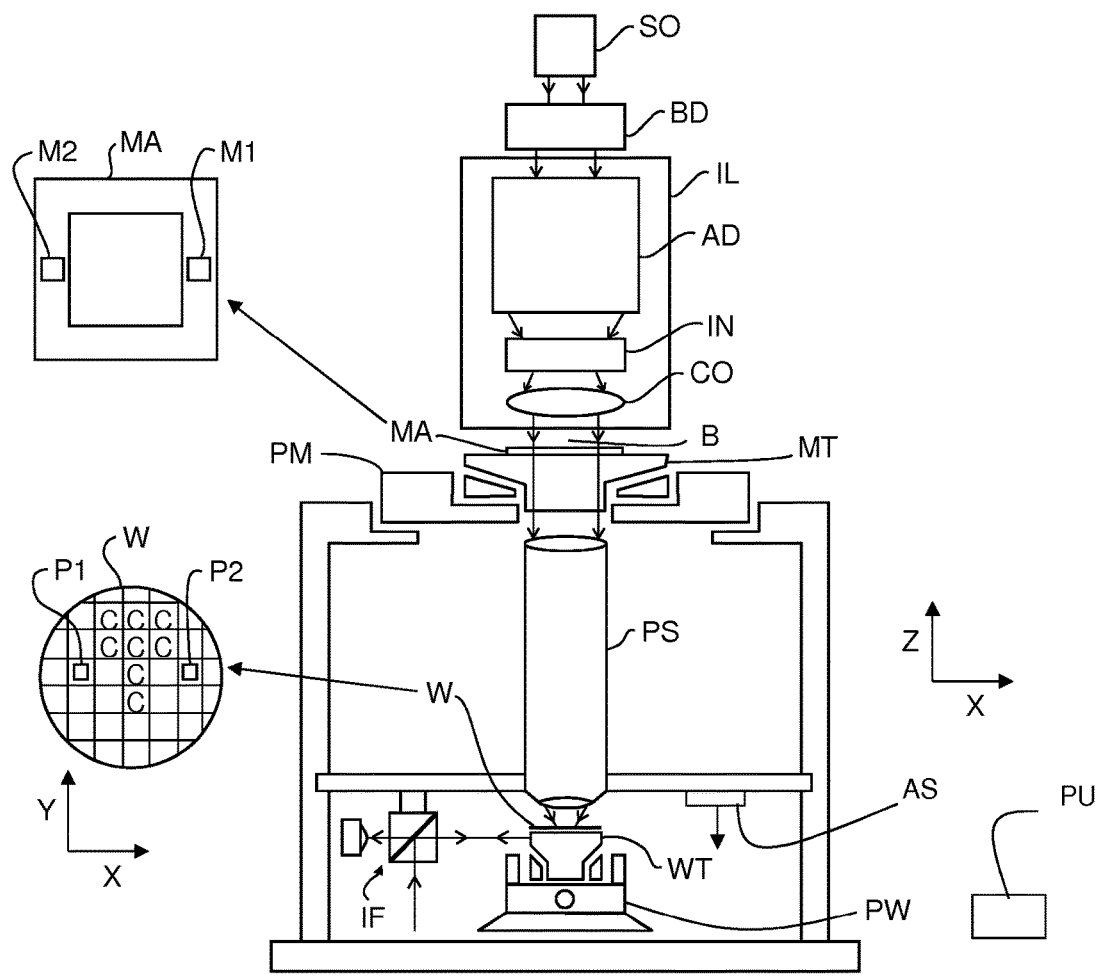
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

In order to facilitate the exposure process, the lithographic apparatus typically comprises one or more sensors, also referred to as metrology sensors that are used to measure certain properties of an object, e.g. a substrate, prior to the object being used in a lithographic process, e.g. exposed. Examples of such sensors e.g. include a level sensor, an overlay sensor and an alignment sensor. Typically, these sensors enable to characterize a particular property of the object by means of measurements. A result of such a measurement of a particular property is referred to, within the meaning of the present invention, as a characteristic of the property. Such a characteristic may e.g. be a particular value of the property, e.g. a height level at a particular position on a substrate it may however also be a vector or tensor representing the property. As an example, an overlay error at a particular position on a substrate may e.g. be characterized as a vector, e.g. both the amplitude and direction of the overlay error at the particular position.

The present invention provides in methods to enhance the performance of metrology sensors. Such sensors have been found to be sensitive to a phenomenon referred to in the present invention as 'measurement parameter dependency', referring to the fact that measurement results obtained using these sensors may vary depending on e.g. a measurement parameter used. Examples of such measurement parameters include but are not limited to, the use of different wavelengths or polarizations in measurement beams, the use of different measurement angles. Also, variations that may e.g. attributed to manufacturing tolerances or sensor imperfections, e.g. drift may be considered examples of such measurement parameter dependency. The present invention advantageously makes use of the observation that such variations in measurements obtained when using different measurement parameters, may be caused by undesired phenomena such as process variations, mark deformations, sensor asymmetries and imperfections and that the sensitivity for such variations has been found to also vary depending on the applied measurement parameter.

In an embodiment, the present invention provides in an initialization method or calibration method for such sensors. Such initialization or calibration method involves determining an optimal way of combining a plurality of measurements as performed by the sensor to arrive at a property of the substrate (e.g. an alignment mark position or a height level), thereby taking proper account of the phenomenon of 'measurement parameter dependency', as will be explained in more detail below.

Embodiments of the initialization method according to the present invention may be performed off line or inline.

The methods according to the present invention that enable the improved performance of the sensors are explained below for an alignment sensor. It can however be noted that the methods as described may readily be applied to the measurements as performed by other metrology sensors such as level sensors or overlay sensors as well.

Further, it can be noted that the initialization method according to the present invention may make use of simulations or measurements or a combination thereof. As will be explained in more detail below, the initialization method according to the present invention makes use of a plurality of so-called sampled characteristics, e.g. scalar values or vectors of a particular property that is measured by the sensor. Within the meaning of the present invention, a sample may either refer to a model such as a mathematical model that is used to simulate a plurality of measurements, using a plurality of different measurement parameters, of the particular property, or it may refer to a substrate onto which a plurality of measurements, using a plurality of different measurement parameters, of the particular property are performed. In order to distinguish both, a reference to a simulation sample refers to a mathematical model used to simulate a particular measurement, e.g. an alignment measurement, whereas a reference to a measurement sample refers to the physical item, i.e. the substrate, in general the object, that is used to perform the measurement on. As such, a more generalized formulation of the initialization method may have the following form:

An initialization method for a sensor, the sensor being configured to perform a plurality of measurements of a property of an object such as a substrate using a respective plurality of different measurement parameters, the method comprising:

estimating a characteristic of the property based on the plurality of measurements, the characteristic comprising a combination of respective outcomes of respective ones of the plurality of measurements weighted by a respective weighting coefficient;

obtaining, for each of a plurality of samples, a plurality of sample characteristics, the sample characteristics representing measurements of the property by means of a respective plurality of different sample parameters;

determining, for each of the samples, a bias as the difference between a theoretical value of the property in accordance with the respective sample and a combination of the sample values of the property of the respective sample weighted by a respective weighting coefficient; the combination of the sample values of the property comprising the plurality of weight coefficients, each weight coefficient of the plurality of weight coefficients being associated with a respective sample parameter of the plurality of different sample parameters; whereby the weighted combination of the sample values of the property of each sample comprising the same plurality of weight coefficients;

using a cost function configured to optimize a correspondence between the sample characteristic of the property and the theoretical characteristic of the property; the cost function being a function of the respective biases of the plurality of models, e.g. comprising a sum of the biases;

optimizing the cost function, thereby deriving the plurality of the weight coefficients from the cost function;

using the weight coefficients and the associated sample parameters in a controller associated with the sensor.

In case the samples represent actual objects, e.g. substrates, the sample characteristics may e.g. be values derived from measurements on a plurality of such substrates. The method in general results in a set of weight coefficients for weighing a plurality of measurements, e.g. a plurality of alignment measurements using different parameters. The method however also enables to match different sensors, e.g. sensors used in different lithographical apparatuses.

In below embodiment, the initialization method according to the present invention is illustrated for an alignment sensor, whereby a plurality of mathematical models is used as samples.

In accordance with an embodiment of the present invention, the lithographic apparatus further comprises an alignment system AS configured to determine a position of one or more alignment marks that are present on a substrate. The alignment system AS according to the present invention may be calibrated by the calibration method according to the present invention and may be configured to perform the alignment method according to the present invention. As such, the alignment system AS enables to obtain, in a more accurate manner, an actual position of a plurality of alignment marks that are provided on a substrate and as a result, provide in an improved way of performing an alignment between a substrate (e.g. provided with a pattern during an exposure process) and a patterning device. In particular, an embodiment of the present invention provides in a method of obtaining a more accurate alignment by taking deformations of alignment marks, e.g. particular asymmetries, into account. It has been observed by the inventors that such alignment mark deformations may cause errors in the alignment measurement process. In particular, alignment mark deformations may cause discrepancies between the positions of the alignment marks as measured and the actual positions.

In accordance with the present invention, the alignment system as applied is configured to perform a plurality of different alignment measurements, thereby obtaining a plurality of measured alignment mark positions for the alignment mark that is considered. Within the meaning of the present invention, performing different alignment measurements for a particular alignment mark means performing an alignment measurement using different measurement parameters or characteristics, the different measurement parameters or characteristics as applied are, within the meaning of the present invention, denoted as different values of a parameter $\lambda$. Such different measurement parameters or characteristics $\lambda_1, \lambda_2, \lambda_3, \lambda_i$ may e.g. include using different optical properties to perform the alignment measurement. As an example, the alignment system as applied in the lithographic apparatus according to the present invention may include an alignment projection system configured to project a plurality of alignment beams having different characteristics or parameters onto alignment mark positions on the substrate and a detection system configured to determine an alignment position based on a reflected beam off of the substrate. As an example, the alignment system as applied in the lithographic apparatus according to the present invention may include an alignment projection system configured to project one or more alignment beams having different characteristics or parameters $\lambda_1, \lambda_2, \lambda_3, \ldots, \lambda_i$ onto alignment mark positions on the substrate and a detection system configured to determine an alignment position based one or more reflected beams off of the substrate.

In an embodiment, the alignment projection system may be configured to sequentially project different alignment beams (i.e. beams having different characteristics or parameters $\lambda_1, \lambda_2, \lambda_3, \ldots \lambda_i$) onto a particular position on a substrate to determine an alignment mark position.

In another embodiment, a plurality of different alignment beams may be combined into one alignment beam having different characteristics or parameters $\lambda_1, \lambda_2, \lambda_3, \ldots \lambda_i$ that is projected onto the substrate to determine the alignment mark position. In such embodiment, it may be advantageous to arrange for the reflected beams off of the substrate to arrive at the detection system at different instances. In order to realize this, use can e.g. be made of a dispersive fiber as e.g. described in U.S. Pat. No. 9,046,385, incorporated herein by reference. Alternatively, the reflected alignment beam, including a plurality of different reflected alignment beams off of the substrate, may be provided to one or more filters to separate the different reflected alignment beams and assess the alignment mark position.

Within the meaning of the present invention, different measurement parameters or characteristics $\lambda_1, \lambda_2, \lambda_3, \ldots \lambda_i$ as applied by the alignment system include at least a difference in polarization of the alignment beam or beams used, a difference in frequency or frequency content of an alignment beam or the alignment beams used, or a difference in diffraction orders used to assess the position of the alignment mark or a difference in illumination angle.

The alignment system according to the present invention, may thus determine, using the different measurement parameters or characteristics $\lambda_1, \lambda_2, \lambda_3, \ldots \lambda_i$, (e.g. using alignment beams having a different color, i.e. frequency or frequency content), a position of an alignment mark. Note that, within the meaning of the present invention, "color" should not be construed as being limited to visible light, but may e.g. also encompass UV or IR radiation, i.e. radiation outside the visible light spectrum.

In an embodiment, the alignment system AS may be configured to perform the position measurements based on one or more diffractions of one or more measurement beams incident on the substrate.

In general, the object of such alignment mark measurements as performed by the alignment system is to determine or estimate a position of the target portions (such as target portions C as shown in FIG. 1) of a next exposure process.

In order to determine these target portion positions, positions of alignment marks that are e.g. provided in scribe-lanes surrounding the target portions are measured. In general, the alignment marks as applied may also include so-called in-die marks or in-product marks, i.e. alignment marks that are located inside the exposed pattern. When the alignment mark positions as measured deviate from nominal or expected positions, one can assume that the target portions where the next exposure should take place, also have deviating positions. Using the measured positions of the alignment marks, one may determine or estimate the actual positions of the target portions, thus ensuring that the next exposure can performed at the appropriate position, thus aligning the next exposure to the target portion.

Note that, in case the patterns of two consecutive layers would not be properly aligned, this could cause a malfunction in the circuit that is manufactured. Such a positional deviation or positional offset between two consecutive layers is often referred to as overlay. Such an overlay may be determined by off line measurements performed once two consecutive layers have been created by exposure processes. Ideally, the alignment process, i.e. the process to determine a position of a previously created layer of patterns based on a position measurement of alignment marks, provides in an accurate determination of the actual position of the alignment marks, based upon which, by appropriate modelling, an accurate determination of the actual position of a previously exposed pattern can be determined. This modelling involves determining, using the determined position of the alignment marks that are e.g. disposed in scribe lanes, the position of the previously exposed patterns. This position of a previously exposed pattern, i.e. the position of the previously exposed layer of the integrated circuits that are manufactured, may then be used as a target position for a next exposure process, i.e. the process of exposing a subsequent layer of the integrated circuit).

Such modelling may involve various mathematical techniques such as approximating or interpolating the alignment mark positions by means of higher order two-dimensional polynomials or other functions. Within the meaning of the present invention, it is assumed that this modelling does not introduce any further deviations or errors. Phrased differently, any errors introduced due to the processing of the alignment mark positions to arrive at the positions of the target portions, which errors would introduce a further overlay, are disregarded or assumed to be non-existent. The same holds for the actual exposure process, which is assumed to project a subsequent pattern accurately onto the target portion.

One of the main reasons for performing an alignment measurement between two consecutive exposures is to take into account any deformations of the substrate that may have occurred after a previous exposure. In general, a substrate will undergo a plurality of processing steps between the creation of two consecutive patterns, these processing steps potentially causing deformations of the substrate and thus displacements of the alignment marks. These displacements of the alignment marks may be characterized as positional deviations of the alignment marks, i.e. deviations between a measured position of an alignment mark and a nominal or expected position of the alignment mark.

Similar to the modelling as described above, when a plurality of measured alignment mark positions are available, and positional deviations, i.e. deviations of the expected alignment mark positions, are determined, these deviations may e.g. be fitted to a mathematical function so as to describe the deformation of the substrate. This may e.g. be a two-dimensional function describing a deviation $\Delta(x,y)$ as a function of an (x,y) position, the x-coordinate and y-coordinate determining the position in a plane spanned by the X-direction and Y-direction. Using such a function, one may then determine or estimate an actual position of a target portion where a next layer or pattern needs to be projected.

In general, one would expect that a measured alignment mark position would not deviate, depending on the measurement characteristic that is used, e.g. the type of alignment beam that is applied.

However, it has been recognized by the inventors that an alignment position measurement as performed by an alignment system may be disturbed by a deformation or asymmetry of the alignment mark itself. Phrased differently, due to a deformation of an alignment mark, a deviating alignment mark position measurement can be obtained, compared to a situation whereby the alignment mark is not deformed. In case no measures are taken, such deviating alignment mark position measurement could result in an erroneous determination of the alignment mark position.

It has further been observed that this type of deviation, i.e. a deviating position measurement caused by an alignment mark deformation, depends on the measurement characteristic as applied.

As an example, when an alignment mark position is measured using different measurement characteristics, e.g. using alignment beams having a different frequency, this may lead to different results, i.e. different measured positions for the alignment marks. This phenomenon, whereby different measured positions are obtained when different measurement characteristics or parameters are applied (e.g. whereby measurement beams having a different frequency or frequency content are applied), is referred to as 'measurement parameter dependency' In case the measurements refer to position measurements of an alignment mark, the occurrence of such 'measurement parameter dependency' may be indicative that the alignment mark that is being measured, has been deformed or has some asymmetry, e.g. caused by processed performed in preparation of the exposure of a pattern onto the substrate.

As such, when a position of an alignment mark is measured using a plurality of different measurement characteristics $\lambda_1, \lambda_2, \lambda_3, \ldots \lambda_i$, e.g. using alignment beams having a different frequency or a single alignment beam comprising beams having different frequencies, different results are obtained, e.g. a plurality of different alignment mark positions may be obtained based on the measurements.

As will be clear from the above, the outcome of the alignment measurement procedure should be an assessment of the actual substrate deformation, i.e. an assessment of the actual positions of the alignment marks, which may then be used to determine an actual position of the target portions for a subsequent exposure.

In view of the effects described, in particular the effects of the alignment mark deformations, the measured alignment mark positions, i.e. the alignment mark positions as derived from the different measurements (i.e. using different measurement characteristics) are both affected by the actual (unknown) substrate deformation and by occurring (unknown) mark deformations causing deviating alignment position measurements. Both effects may be interpreted as a deviation between an expected alignment mark position and a measured alignment mark position. As such, when a position deviation is observed, it may either be caused by an actual substrate deformation or by an alignment mark deformation or by a combination thereof.

Figure 2:
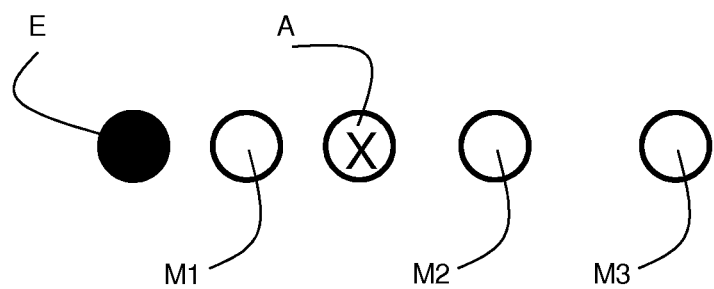
FIG. 2 depicts several possible alignment measurement results when applying different measurement parameters.
Figure 2:
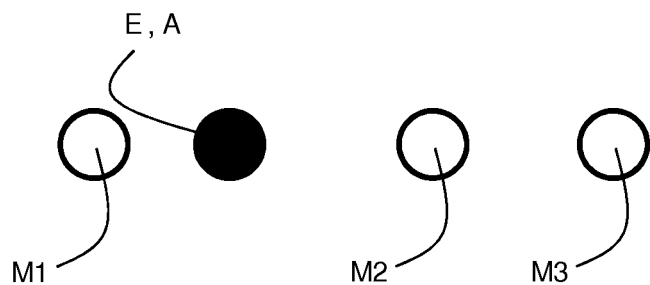
Figure 2:
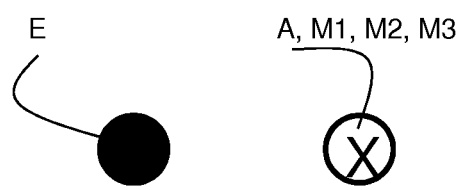

FIG. 2 schematically depicts some possible scenarios; Assuming that three measurements M1, M2, M3 are performed to determine a position of an alignment mark X. FIG. 2(a) schematically shows the nominal or expected position E of the alignment mark and the measured positions M1, M2, M3. FIG. 2(a) further shows the actual position A of the alignment mark. As can be seen, none of the measurements performed provide in an accurate representation of the actual position deviation (E-A), i.e. the difference between the expected position E and the actual position A.

The scenario as depicted in FIG. 2(a) thus involves an actual displacement of an alignment mark (the actual alignment mark position A differs from the expected position E) combined with a mark deformation causing deviating measurements.

FIG. 2(b) shows an alternative scenario whereby differences are observed in the measurements (M1, M2, M3), the measured positions differing from the expected position E, while the actual position A is assumed to coincide with the expected position E. In this scenario, the measurements would imply that there is a positional deviation of the alignment mark, whereas, in reality, there is none, i.e. the position of the alignment mark is not affected by a substrate deformation. FIG. 2(c) schematically shows a third scenario whereby all three measurements M1, M2, M3 coincide and coincide with the actual position A. Such a scenario may occur when there is no alignment mark deformation affecting the measurements.

With respect to the occurring substrate deformations and mark asymmetries or mark deformations, the following should be noted: As already indicated above, in between two consecutive exposure steps, i.e. the consecutive application of particular patterns onto target portions such as target portions C as shown in FIG. 1, a substrate undergoes various processes outside the lithographic apparatus. These processes may cause the aforementioned substrate deformations and mark deformations or mark asymmetries.

Two types of process equipment are generally used for the processing of substrates outside a lithographic apparatus, affecting the substrates in a different manner.

A first type of equipment can be characterized as surface modifying equipment, such equipment or process tool processing the exposed surface of the substrate. Examples of such tools include tools for etching a substrate or tools for rendering the top surface substantially flat, such as CMP (Chemical Mechanical Planarization) tools.

A second type of equipment can be characterized as processing the substrate as a whole, or the bulk of the substrate. Such processing e.g. include thermal processing of the substrate or mechanical handling of a substrate. Typically, these bulk modifying tools may introduce mechanical stresses in the substrate resulting into strain, i.e. a deformation of the substrate.

It has been observed by the inventors that the first type of equipment typically results in deformations of the alignment marks themselves, and e.g. introduces mark asymmetries. The second type of equipment has been devised to result in actual deformations of the substrate as a whole, thus resulting in actual displacements of the alignment marks with respect to their expected or nominal position. As such, in general, when a substrate is brought into a lithographic apparatus after being processed, both mark deformations and substrate deformations may have been introduced due to the processing.

As such, when subsequently the position of a plurality of alignment marks on the substrate is determined using an alignment system AS according to the present invention, the position measurements may be affected by both mark and substrate deformations, e.g. resulting in different position measurements when using different measurement parameters or characteristics $\lambda$.

The present invention provides, in an embodiment, in a manner to determine an optimal combination of such a set of different position measurements of an alignment mark. In particular, in the embodiment as described below, the present invention makes use of simulations of alignment measurements to arrive at a set of weight coefficients which can be applied in an alignment sensor or system AS. Note that, as indicated above, either use can be made of a plurality of simulation samples, i.e. mathematical models, or use can be made of measurement samples, i.e. substrates onto which measurements are performed, to arrive at the input data required to determine the weight coefficients. Note that a combination of both, i.e. a combination of simulated data and measurement data may be considered as well. Below, a more detailed embodiment that makes use of simulated data is discussed:

The purpose of the simulations and of the processing of these simulations is to arrive, in the described embodiment at a so-called 'estimator', in particular an 'alignment position estimator'.

Within the meaning of the present invention, estimator is used to indicate a function that is used to estimate or characterize the property that is examined, e.g. an alignment position or height level.

As such, the use of an estimator may also be referred to, in an embodiment, as estimating a characteristic of the property based on a plurality of measurements, whereby the characteristic, e.g. the value of the property that is looked for, includes a combination of outcomes of the plurality of measurements, whereby the outcomes, i.e. the measured characteristics, are weighted by respective weighting coefficients.

In the embodiment described, such an alignment position estimator thus includes a set of weight coefficients, associated with a set of simulated measurement parameters. In the present invention, a simulated measurement parameter, or in short, a simulated parameter refers to a measurement parameter or characteristic of the alignment sensor as used in the simulations. Once the set of weight coefficients is determined, these weight coefficients can be applied during an actual alignment measurement process, to calculate a weighted combination of a set of position measurements of an alignment mark (using the set of weight coefficients) as the estimated or expected alignment mark position.

In an embodiment, referred to as the predictor form or predictor part of the alignment position estimator, the following form or format for the alignment position estimator is applied:

$$y = \underline{w}^\dagger \underline{x} \quad (1)$$

Where:
the dagger denotes the transpose operator;
y denotes the estimated alignment position;
$\underline{x}$ denotes a Mx1 vector comprising a set of M alignment position measurements as performed by an alignment sensor, e.g. an alignment sensor or system AS;
M ∈ {1, 2, 3, ... } denotes the total number of alignment measurements that are performed to measure the position of a particular alignment mark. M thus denotes the number of distinct measurement characteristics or parameters $\lambda_1, \lambda_2, \lambda_3, \ldots \lambda_i$ as used to measure the position of the particular alignment mark. As such, M corresponds to the different wavelengths, polarizations, illumination angles and/or diffraction order combinations that are used in the plurality of alignment mark position measurements as performed by the alignment sensor.

$$\underline{w} \in \left\{ \underline{w} \in \mathbb{R}^{M \times 1} : \sum_{m=1}^{M} (\underline{w})_m = 1 \right\},$$

denotes the weight coefficients or weights of the predictor that are applied to the alignment position measurements $\underline{x}$ to arrive at the estimated alignment position. In order to maintain the proper unit of the estimated alignment position, the sum of the weights $\underline{w}$ can be set equal to one, i.e.

$$\sum_{m=1}^{M} (\underline{w})_m = 1.$$

As an example, an alignment system AS may be equipped to perform alignment measurements using 4 different alignment beams, denoted by $\lambda_1, \lambda_2, \lambda_3, \lambda_4$. Vector $\underline{x}$ may thus consist of 4 measurements:

$$\underline{x} = \begin{bmatrix} x(\lambda_1) \\ x(\lambda_2) \\ x(\lambda_3) \\ x(\lambda_4) \end{bmatrix} \quad (2)$$

Where:
$x(\lambda_1)$ represents the alignment measurement result obtained using parameter $\lambda_1$;
$x(\lambda_2)$ represents the alignment measurement result obtained using parameter $\lambda_2$;
$x(\lambda_3)$ represents the alignment measurement result obtained using parameter $\lambda_3$;
$x(\lambda_4)$ represents the alignment measurement result obtained using parameter $\lambda_4$.

For this example, vector $\underline{w}$ may thus consist of 4 weight coefficients:

$$\underline{w} = \begin{bmatrix} w(\lambda_1) \\ w(\lambda_2) \\ w(\lambda_3) \\ w(\lambda_4) \end{bmatrix} \quad (3)$$

Whereby:
$\underline{w}(\lambda_1)$ represents the weight coefficient applied to the alignment measurement performed by using parameter $\lambda_1$;
$\underline{w}(\lambda_2)$ represents the weight coefficient applied to the alignment measurement performed by using parameter $\lambda_2$;
$\underline{w}(\lambda_3)$ represents the weight coefficient applied to the alignment measurement performed by using parameter $\lambda_3$;
$\underline{w}(\lambda_4)$ represents the weight coefficient applied to the alignment measurement performed by using parameter $\lambda_4$;

Once the weight coefficients w are known, an alignment system AS, as e.g. applied in a lithographic apparatus according to the present invention, may perform, for each of a plurality of alignment marks, a set of M alignment measurements (using the measurement parameters by $\lambda_1, \lambda_2, \lambda_3, \lambda_4$) and apply the weight coefficients $\underline{w}$ to arrive at an estimated position of the alignment mark.

The present invention provides in various methods to arrive at the weight coefficients $\underline{w}$. In particular, in order to determine the weight coefficients vector $\underline{w}$, the present invention makes use of simulations. In case of an alignment sensor, the simulations involve using models for simulating the measurement of the position of an alignment mark, by means of a plurality of different measurement parameters or characteristics. In particular, a portion of a stack of a substrate, the portion of the stack including an alignment mark, is modelled and used to simulate a set of alignment measurements, using different alignment measurement parameters or characteristics.

In order to determine the weight coefficients vector $\underline{w}$, the embodiment of the present invention makes us of a plurality of such models, whereby the plurality of models differ from one another in that the geometry and/or physical properties of the modelled stack portion are different and/or the operational properties of the modelled sensor are different. As an example, alignment mark deformations as may be caused by processing of a substrate may be modelled and the effects of the deformations on alignment measurements may be simulated.

Figure 3:
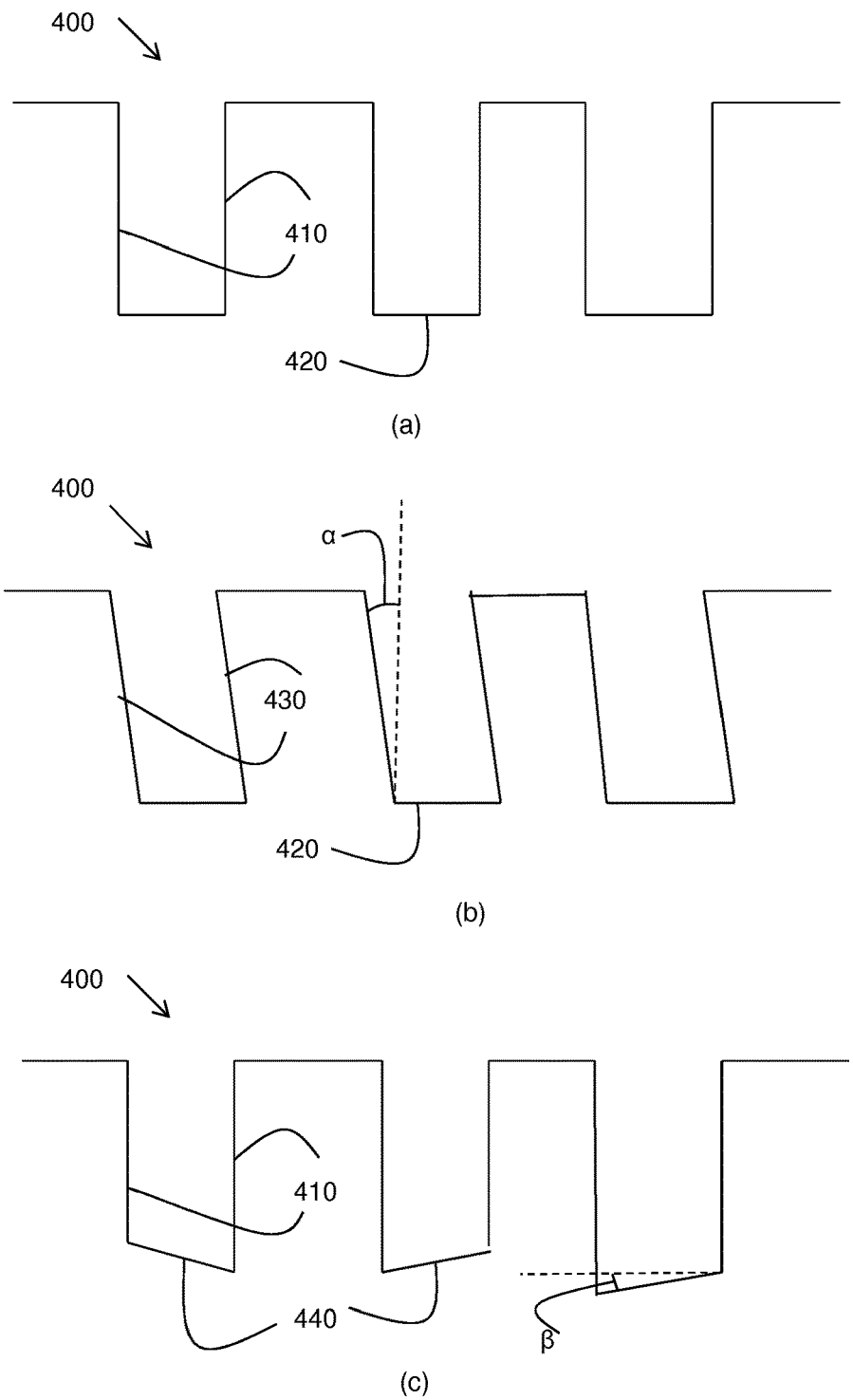
FIG. 3 depicts a cross-section an alignment mark and possible alignment mark deformations.

FIG. 3 schematically shows some possible alignment mark deformations.

FIG. 3(a) schematically shows the alignment mark 400 without any deformations and/or asymmetries, i.e. having substantially vertical side walls 410 and a substantially horizontal bottom portion 420. FIG. 3(b) schematically shows the alignment mark 400 having slanted side walls 430. Such slanted side walls may be considered a mark deformation and may be characterized by an angle α. FIG. 3(c) schematically shows the alignment mark 400 having a tilted bottom portion 440. Such a tilted bottom portion may also be considered a mark deformation and may be characterized by a tilt angle β of the alignment mark. FIGS. 3(b) and 3(c) thus illustrate two possible mark deformations which may have an effect on a mark position measurement as performed by an alignment sensor or system.

Figure 4A:
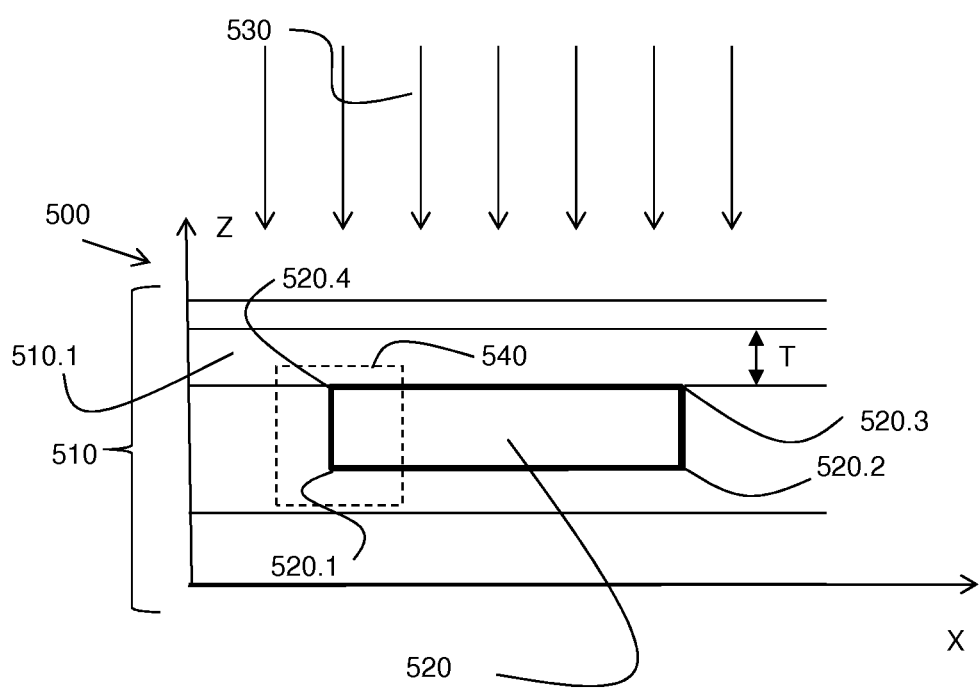
FIGS. 4a and 4b depict a simulation model of part of a stack of a substrate.

Within the meaning of the present invention, the plurality of models or simulation models that is used to determine the weight coefficients $\underline{w}$ are also referred to as training samples. FIG. 4 schematically shows such a model 500 of a portion of a stack of a substrate, including an alignment mark. Within the meaning of the present invention, stack refers to the set of layers 510 that is applied on a substrate, said layers having different optical or electromagnetic properties, e.g. due to the use of different materials. The stack of layers 510, or in short the stack 510, as schematically shown in FIG. 4 further comprises an alignment mark 520. In the model 500 as shown, the alignment mark 520 may be considered to be in a nominal position (along the X-axis) and having a nominal or expected geometry. The model 500 as schematically shown may be used in simulations, whereby an alignment measurement is simulated. Such a simulation may e.g. involve simulating the response of the model to an alignment beam, schematically indicated by the arrows 530, that is incident on to stack of layers 510. Based on this response, one may determine the position, in particular the Y-position, of the alignment mark 520 as modelled.

In order to address the issue of alignment mark deformations, a plurality of models such as model 500 are applied for simulating the response of an alignment beam.

Such a plurality of models may e.g. be constructed by varying a position of the corners 520.1-520.4 of the alignment mark 520.

Figure 4B:
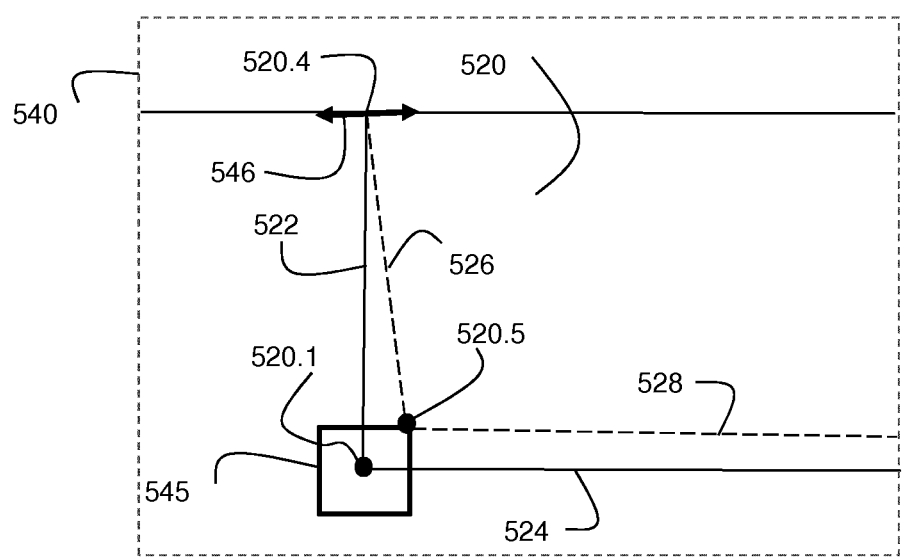

FIG. 4b schematically shows a close-up of portion 540 of the model 500.

FIG. 4b schematically shows a portion of the alignment mark 520 as modelled, including one side wall 522 and part of the bottom 524 of the alignment mark 520. Corner 520.1 as shown is in a nominal position 520.1. in order to model a deformation of alignment mark 520, the corner 520.1 may e.g. be displaced to any location inside the area 545, e.g. a rectangular area representing a possible deformation of the alignment mark. In particular, when the corner 520.1 is e.g. displaced to the position as indicated by the 520.5, the geometry of the side wall 522 and the bottom 524 are changed. The dotted lines 526 and 528 indicating the positions of the side wall and bottom of the alignment mark 520 when the corner 520.1 is moved to the position indicated by 520.5.

In an embodiment, the deformation of the alignment mark as applied in a particular model can be determined randomly. Alternative, a two-dimensional grid can be applied inside the area 545, thereby generating n×m different positions for the corner 520.1 of the alignment mark 520, n being the number of positions considered along the X-axis, m being the number of positions considered along the Z-axis.

In a similar manner, the position of the corner 520.2 may be modified. Further, corners 520.3 and 520.4 of the alignment mark 520 may also be displaced, e.g. along the X-axis. As an example, corner 520.4 as shown in FIG. 4b may be displaced along the X-axis within the range indicated by arrow 546.

The generation of the plurality of models may also involve changing other parameters of the stack 510, apart from the geometry of the alignment mark. In particular, the generation of the plurality of simulation models or training samples may also involve changing the geometry of one or more layers of the modelled stack. As an example, a thickness T of a layer 510.1 as shown in FIG. 4b, may e.g. be varied within a range of +10% to −10% of an nominal thickness. In a similar manner, physical properties of the layers as applied in the model, such as optical parameters, may be varied as well within certain ranges.

Summarizing, the plurality of models used for the measurement simulations may be obtained by applying one or more of the following modifications to a model having the nominal or expected geometry and physical properties:
- modifying a shape or size of the alignment mark as modelled;
- modifying any other geometrical parameter of the model such as a thickness of a layer of the stack;
- modifying a physical property as applied in the model, e.g. a physical properties of one of the layers or the alignment mark as modelled.
- Modifying properties of the sensing process that is simulates, thus modelling sensor variations occurring in real life.

As mentioned, these variations may be applied in a random manner or may be applied in a more structured manner to arrive at the plurality of models.

Typically, the number of models that is considered to take into account possible deformations of the alignment mark and other possible deviations may be comparatively high, e.g. in a range from 100 to 100000.

In accordance with the present invention, the different models or samples may be used to simulate alignment measurements, whereby alignment measurements are simulated for a plurality of alignment measurement characteristics or parameters λ. Within the meaning of the present invention, reference is made to a simulated measurement parameter λ, or in short, a simulated parameter λ, to indicate a corresponding measurement parameter or characteristic λ of the alignment sensor. Note however that, in general, the set of simulation parameters λ used in the simulations need not be the same as the set of measurement parameters λ as applied by the alignment sensor during an alignment measurement procedure. As an example, it may be advantageous to simulate the alignment measurements with a set of S simulation parameters, a first subset of the set of simulation parameters corresponding to the alignment measurement parameters as applied by a first alignment sensor and a second subset of the set of simulation parameters corresponding to the alignment measurement parameters as applied by a second alignment sensor. However, as will be apparent from equation (1), the weight coefficients as derived from the simulations (e.g. based on set of simulation parameters λ used in the simulations) should correspond to, or be associated with, measurement parameters or characteristics λ that are actually applied by the alignment sensor.

Further on, it is assumed that there is a one-to-one correspondence between the parameters as applied in the simulations (i.e. the simulated measurement parameters λ, or in short, the simulated parameters λ) and the parameters that are applied as measurement parameters or characteristics λ of the alignment sensor.

In case T samples or models are available and each model is subjected to M alignment measurement simulations (i.e. using M different alignment measurement characteristics or parameters λ), a set of T×M simulation results is obtained.

For each sample, a set of M simulations is thus available, representing the alignment measurement simulation using M different measurement characteristics, e.g. the same characteristics as are available to perform the actual alignment measurements using an alignment system AS. For each of the models used, the simulation results (i.e. the positions of the alignment mark, e.g. alignment mark 520, as derived from the simulations) may be compared to an theoretical position of the alignment mark in the model. The results of the simulations may be expressed in a similar manner as in equation (1). In order to make a distinction between actual measurements and simulations, a subscript t is applied for the simulated data, $t \in \{1, 2, 3, \ldots, T\}$, whereby $T \in \{1, 2, 3, \ldots\}$ denotes the total number of training samples or models that is used.

For each of the samples t, the theoretical aligned position of the mark (e.g. mark 520 of FIG. 4*a*) is further denoted as $y_{training,t}$. Note that this theoretical aligned position may also be user defined, i.e. application specific.

Figure 5:
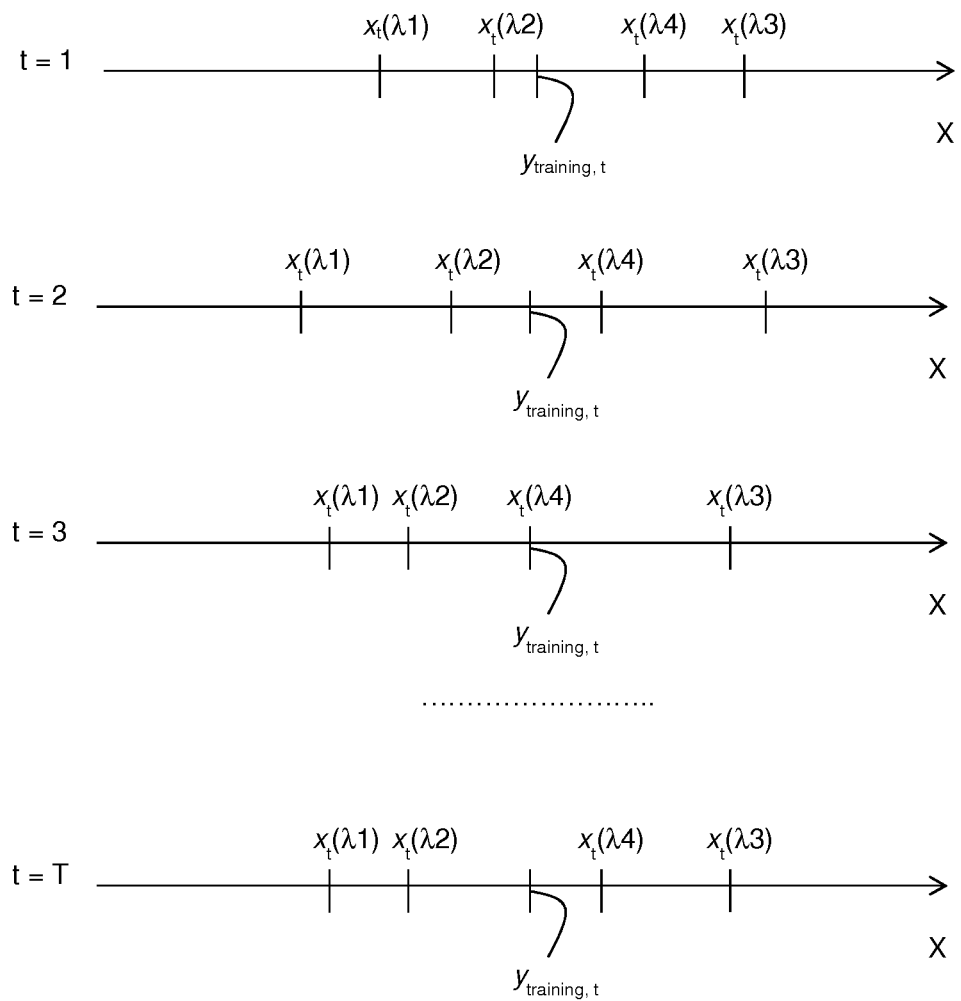
FIG. 5 schematically depicts the simulated alignment mark positions as obtained for a set of T samples.

FIG. 5 schematically shows, for a plurality of samples T, simulated values $\underline{x}_t$ for the alignment mark position, given a set of 4 simulation parameters $\lambda_1, \lambda_2, \lambda_3, \lambda_4$.

As can be seen, for training sample t=1, none of the simulations, using the simulation parameters $\lambda_1, \lambda_2, \lambda_3, \lambda_4$ results in a simulated position $\underline{x}_t$ equal to the theoretical aligned position of the mark $y_{training,t}$ in the sample t=1. In training sample t=3, one can observe that the simulated position using parameter $\lambda_3$, indicated as $x_t(\lambda_3)$ substantially equals to the theoretical aligned position of the mark $y_{training,t}$ in the sample t=3.

In the present invention, several methods are described to derive a value of the weight coefficients $\underline{w}$.

In a first embodiment, use is made of a cost function, or optimization function, that is optimized, e.g. minimized, to arrive at the weight coefficients $\underline{w}$.

A first example of such a cost function includes the sum, over all samples T, of the squared biases of the simulations.

Within the meaning of the present invention, bias is used to denote the difference between the theoretical aligned position of a simulated mark $y_{training,t}$ of training sample t and the weighted combination as derived from the simulated measurements $\underline{x}_t$. The sum of the squared biases of all the training samples T may be expressed as:

$$\sum_{t=1}^{T}(y_t - y_{training,t})^2 = \sum_{t=1}^{T}(\underline{w}^\dagger \cdot \underline{x}_t - y_{training,t})^2 \quad (4)$$

When considering the sum of all squared biases as the cost function, optimal values of the weight coefficients $\underline{w}$ can be found by setting the derivative with respect to the variables $\underline{w}$ equal to zero:

$$\frac{\partial}{\partial \underline{w}} \cdot \left(\sum_{t=1}^{T}(y_t - y_{training,t})^2\right) = \frac{\partial}{\partial \underline{w}} \cdot \sum_{t=1}^{T}(\underline{w}^\dagger \cdot \underline{x}_t - y_{training,t})^2 \quad (5)$$

$$= 2 \cdot \sum_{t=1}^{T}(\underline{w}^\dagger \cdot \underline{x}_t - y_{training,t}) \cdot \underline{x}_{t^*} = 0$$

Solving equation (5), together with the constraint that $$\sum_{m=1}^{M}(\underline{w})_m = 1$$

enables to derive a value for the weight coefficients $\underline{w}$.

A second example of the cost function includes, in addition to the sum of all squared biases, an estimate of the reproducibility of the alignment measurements. As will be apparent to the skilled person, when performing alignment measurements, these measurements may be affected by noise and/or uncertainties and/or systematic errors with respect to the measurement parameters that are actually applied. Phrased differently, minor deviations in the applied measurement parameters λ (which will in general be unknown when the measurements are performed) may affect the actual measurement. The degree at which these deviations affect the actual measurement may be different for the different measurement parameters. Certain measurement parameters may be more robust to such deviations than others.

It has been devised by the inventors that it may be advantageous to take this reproducibility of the measurements into account when determining the optimal weight coefficients.

It is therefore proposed, in the second example of the cost function, to include, as a measure for the reproducibility or robustness of the measurements, the variance of y, i.e. the estimated alignment position.

The variance of y can be expressed as a function of the covariance matrix of $\underline{x}$, denoted by $\underline{C}_x$, as follows:

$$\sigma_y^2 = \frac{\partial}{\partial \underline{x}} \cdot (\underline{w}^\dagger \cdot \underline{x}) \cdot \underline{C}_{\underline{x}} \cdot \left(\frac{\partial}{\partial \underline{x}} \cdot (\underline{w}^\dagger \cdot \underline{x})\right)^\dagger \quad (6)$$

$$= \underline{w}^\dagger \cdot \underline{C}_{\underline{x}} \cdot \underline{w}.$$

In a similar manner, the variance may be determined for each of the training samples T and a sum of the variances of all the training samples may be included in the cost function. The sum of the sample variances can be expressed as (subscript t referring to the use of training data or data obtained from the simulations):

$$\sum_{t=1}^{T} \sigma_{y,t}^2 = \sum_{t=1}^{T} \underline{w}^\dagger \cdot \underline{C}_{\underline{x}_t} \cdot \underline{w} \quad (7)$$

$$= \underline{w}^\dagger \cdot \left(\sum_{t=1}^{T} \underline{C}_{\underline{x}_t}\right) \cdot \underline{w}.$$

Combining equations (7) and (4) as the cost function results in:

$$\sum_{t=1}^{T}(y_t - y_{training,t})^2 + \sigma_{y,t}^2 \quad (8)$$

Note that in equation (8), the summation over t is assumed to apply for both the squared biases and the variances.

The derivative of the sum of all training sample variances with respect to the variables $\underline{w}$ equals $$\frac{\partial}{\partial \underline{w}} \cdot \left(\sum_{t=1}^{T} \sigma_{y,t}^2\right) = \frac{\partial}{\partial \underline{w}} \cdot \left(\underline{w}^\dagger \cdot \left(\sum_{t=1}^{T} \underline{C}_{\underline{x}_t}\right) \cdot \underline{w}\right) \quad (9)$$

$$= \frac{\partial \underline{w}^\dagger}{\partial \underline{w}} \cdot \left(\sum_{t=1}^{T} \underline{C}_{\underline{x}_t}\right) \underline{w} + \underline{w}^\dagger \cdot \left(\sum_{t=1}^{T} \underline{C}_{\underline{x}_t}\right) \cdot \frac{\partial \underline{w}}{\partial \underline{w}}$$

$$= 2 \cdot \left(\sum_{t=1}^{T} \underline{C}_{\underline{x}_t}\right) \cdot \underline{w}.$$

Using the derivatives as shown in equations (5) and (9), the condition to find optimal values for the weight coefficients $\underline{w}$ becomes:

$$\frac{\partial}{\partial \underline{w}} \cdot \left(\sum_{t=1}^{T}(y_t - y_{training,t})^2 + \sigma_{y,t}^2\right) = \underline{0} \quad (10)$$

$$2 \cdot \left(\sum_{t=1}^{T} \underline{C}_{\underline{x}_t}\right) \cdot \underline{w} + 2 \cdot \sum_{t'=1}^{T}(\underline{w}^\dagger \cdot \underline{x}_{t'} - y_{training,t'}) \cdot \underline{x}_{t'} = \underline{0}$$

$$\left(\sum_{t=1}^{T} \underline{C}_{\underline{x}_t}\right) \cdot \underline{w} + \sum_{t'=1}^{T}(\underline{w}^\dagger \cdot \underline{x}_{t'}) \cdot \underline{x}_{t'} = \sum_{t''=1}^{T} y_{training,t''} \cdot \underline{x}_{t''}$$

$$\left(\sum_{t=1}^{T} \underline{C}_{\underline{x}_t}\right) \cdot \underline{w} + \sum_{t'=1}^{T} \underline{x}_{t'} \cdot \underline{x}_{t'}^\dagger \cdot \underline{w} = \sum_{t''=1}^{T} y_{training,t''} \cdot \underline{x}_{t''}$$

$$\left(\left(\sum_{t=1}^{T} \underline{C}_{\underline{x}_t}\right) + \sum_{t'=1}^{T} \underline{x}_{t'} \cdot \underline{x}_{t'}^\dagger\right) \cdot \underline{w} = \sum_{t''=1}^{T} y_{training,t''} \cdot \underline{x}_{t''}.$$

Taking the constraint $$\sum_{m=1}^{M}(w)_m = 1$$

into account, the following Karush-Kuhn-Tucker system of equations can be solved:

$$\begin{bmatrix} \left(\sum_{t=1}^{T} \underline{C}_{\underline{x}_t}\right) + \sum_{t'=1}^{T} \underline{x}_{t'} \cdot \underline{x}_{t'}^\dagger & \underline{1} \\ \underline{1}^\dagger & 0 \end{bmatrix} \cdot \begin{bmatrix} \underline{w} \\ -\lambda \end{bmatrix} = \begin{bmatrix} \sum_{t''=1}^{T} y_{training,t''} \cdot \underline{x}_{t''} \\ 1 \end{bmatrix} \quad (11)$$

Where $\lambda$ denotes the Lagrange multiplier of the constraints $$\sum_{m=1}^{M}(w)_m = 1.$$

The optimal values of the variables $\underline{w}$ can be computed by solving this linear system of equations.

It can further be noted that the matrix $$\begin{bmatrix} \left(\sum_{t=1}^{T} \underline{C}_{\underline{x}_t}\right) + \sum_{t'=1}^{T} \underline{x}_{t'} \cdot \underline{x}_{t'}^\dagger & \underline{1} \\ \underline{1}^\dagger & 0 \end{bmatrix}$$

is a symmetrical matrix, which may be beneficial when computing a solution for this linear system of equations.

Note that computing a solution to the Karush-Kuhn-Tucker system of equations (11) is equivalent with solving the following quadratic program:

$$\min \left( \frac{1}{2} \cdot \underline{w}^\dagger \cdot \left(\left(\sum_{t=1}^{T} \underline{C}_{\underline{x}_t}\right) + \sum_{t'=1}^{T} \underline{x}_{t'} \cdot \underline{x}_{t'}^\dagger\right) \cdot \underline{w} - \underline{w}^\dagger \cdot \left(\sum_{t''=1}^{T} y_{training,t''} \cdot \underline{x}_{t''}\right) \right),$$

subject to $\underline{1}^\dagger \cdot \underline{w} = 1$.

Note that in order to reduce the amplitude of the resulting weights (which can be beneficial for the propagation of sensor errors), one can add additional constraints on the weights and/or include an additional extra regularization term, as follows (here written in quadratic program form for convenience):

$$\min \left( \frac{1}{2} \cdot \underline{w}^\dagger \cdot \left(\left(\sum_{t=1}^{T} \underline{C}_{\underline{x}_t}\right) + \sum_{t'=1}^{T} \underline{x}_{t'} \cdot \underline{x}_{t'}^\dagger + \mu \cdot \underline{I}\right) \cdot \underline{w} - \underline{w}^\dagger \cdot \left(\sum_{t''=1}^{T} y_{training,t''} \cdot \underline{x}_{t''}\right) \right),$$

subject to $\underline{1}^\dagger \cdot \underline{w} = 1$ and $w_{lb} \cdot \underline{1} \leq \underline{w} \leq w_{ub} \cdot \underline{1}$.

Where:

$\mu = \{\mu \in \mathbb{R} : \mu \geq 0\}$ denotes the regularization parameter on the weights $\underline{w}$;

$w_{lb} = \{w_{lb} \in \mathbb{R} : w_{lb} \leq w_{ub}\}$ and $w_{ub} = \{w_{ub} \in \mathbb{R} : w_{lb} \leq w_{ub}\}$ denote the lower and upper bound on the weights $\underline{w}$.

In order to apply the cost function according to the second example, the simulations as performed on the T samples thus need to include the calculation, an approximation or an estimation of the covariance matrices of the samples, in addition to the simulation of the alignment measurements, using the different simulation parameters $\lambda$.

It can further be noted that, in the cost functions as described, all samples or models are considered equally important. This can be seen by considering that the variances of the different samples are summed and, similarly, that the biases of the different samples are summed. As such, in the examples given, the likelihood that a particular model actually occurs in practice is not considered. In case such a likelihood can be determined or estimated, it could be taken into account by weighing the biases or variances of the least likely models down and/or weighing the biases or variances of the most likely models up.

Further, when considering the cost function (8), it can be noted that the sum of the variances is given the same weight or importance as the sum of the biases. As an alternative, one could e.g. scale either one of the sum of the variances or the sum of the biases in order give more weight or importance to either the variances or the biases.

In a second embodiment of the alignment position estimator, the alignment position estimator includes an additional term referred to as the corrector or corrector part.

In the most generic form, the combination of the predictor and the corrector or corrector part can be formulated as:

$$y = \underline{w}^\dagger \cdot \underline{x} + f(\underline{x} - \underline{w}^\dagger \cdot \underline{x})$$

Where f is an unknown function.

Below, a specific form of the combination of the predictor and corrector of the alignment position estimator is developed:

$$y = \underline{w}^\dagger \cdot \underline{x} + \underline{\omega}^\dagger \cdot \underline{\phi}(\underline{x} - \underline{w}^\dagger \cdot \underline{x}) \quad (12)$$
$$= \underline{w}^\dagger \cdot \underline{x} + \underline{\omega}^\dagger \cdot \underline{\phi}(\underline{D} \cdot \underline{x}).$$

Where $\underline{\omega}$ is a B×1 vector denoting the weights of the corrector.

Where $\underline{\phi}$ is a B×1 vector denoting a set of basis-functions.

Where $B \in \{1, 2, 3, \ldots\}$ denotes the total number of basis-functions.

Where we have introduced the following shorthand notation:

$$\underline{D} = \left( \underline{I} - \begin{bmatrix} \underline{w}^\dagger \\ \underline{w}^\dagger \\ \vdots \\ \underline{w}^\dagger \end{bmatrix} \right).$$

Compared to the alignment position estimator of the first embodiment, the alignment position estimator further includes a further weighted combination (using weight coefficients $\underline{\omega}$) of a function of the remaining differences between the weighted (using weights $\underline{w}$) combination of the measurements $\underline{x}$ and the estimated alignment position y. These remaining differences are further on also referred to as measurement biases. From a practical point of view, this can be seen as the corrector or corrector part of the alignment position estimator focusing on the correction of the mark deformation that may have occurred. In the second embodiment of the alignment position estimator, values for the weight coefficients $\underline{w}$ and the weight coefficients $\underline{\omega}$ are again determined based on simulations performed on a set of T models as described above.

In the following, a method is described to determine the further weight coefficients or weight coefficients $\underline{\omega}$ based on simulated data as described above. In the described method, it is assumed that the weights or weight coefficients $\underline{w}$ have already been determined, using any of the methods described above. However, the possibility of solving equation (12) simultaneously for both the weight coefficients $\underline{w}$ and the weight coefficients $\underline{\omega}$ should not be excluded.

From a simplicity point of view, it may however be preferred to solve for the weight coefficients $\underline{w}$ and the weight coefficients $\underline{\omega}$ sequentially, i.e. first solving a linear set of equations to obtain the weight coefficients $\underline{w}$, and subsequently, as will be explained below, solving a second linear set of equations to obtain the weight coefficients $\underline{\omega}$.

As in the first embodiment, the weight coefficients $\underline{\omega}$ are again determined by minimizing a cost function or optimization function.

The cost function as will be applied in the second embodiment is the mean sum (taken over all T samples or training samples) of the squared biases and the variances, similar to the second example of the first embodiment. Note that, similar to the equation (6), the variance of y can be expressed as a function of the covariance matrix of $\underline{x}$, as follows $$\sigma_y^2 = \frac{\partial}{\partial \underline{x}} \cdot (\underline{w}^\dagger \cdot \underline{x} + \underline{\omega}^\dagger \cdot \underline{\phi}(\underline{x} - \underline{w}^\dagger \cdot \underline{x})) \cdot \underline{C}_{\underline{x}} \cdot \quad (13)$$

$$\left( \frac{\partial}{\partial \underline{x}} \cdot (\underline{w}^\dagger \cdot \underline{x} + \underline{\omega}^\dagger \cdot \underline{\phi}(\underline{x} - \underline{w}^\dagger \cdot \underline{x})) \right)^\dagger$$

$$= \left( \underline{w}^\dagger + \underline{\omega}^\dagger \cdot \frac{\partial \underline{\phi}(\underline{x} - \underline{w}^\dagger \cdot \underline{x})}{\partial \underline{x}} \right) \cdot \underline{C}_{\underline{x}} \cdot$$

$$\left( \underline{w}^\dagger + \underline{\omega}^\dagger \cdot \frac{\partial \underline{\phi}(\underline{x} - \underline{w}^\dagger \cdot \underline{x})}{\partial \underline{x}} \right)^\dagger$$

$$= \left( \underline{w}^\dagger + \underline{\omega}^\dagger \cdot \frac{\partial \underline{\phi}(\underline{D} \cdot \underline{x})}{\partial \underline{x}} \right) \cdot \underline{C}_{\underline{x}} \cdot \left( \underline{w}^\dagger + \underline{\omega}^\dagger \cdot \frac{\partial \underline{\phi}(\underline{D} \cdot \underline{x})}{\partial \underline{x}} \right)^\dagger.$$

In the cost function used to find the weight coefficients $\underline{\omega}$, the sum of the variances of all training samples T can be expressed as:

$$\sum_{t=1}^{T} \sigma_{y,t}^2 = \sum_{t=1}^{T} \left( \underline{w}^\dagger + \underline{\omega}^\dagger \cdot \frac{\partial \underline{\phi}(\underline{D} \cdot \underline{x}_t)}{\partial \underline{x}} \right) \cdot \underline{C}_{\underline{x}_t} \cdot \left( \underline{w}^\dagger + \underline{\omega}^\dagger \cdot \frac{\partial \underline{\phi}(\underline{D} \cdot \underline{x}_t)}{\partial \underline{x}} \right)^\dagger. \quad (14)$$

The sum of the squared biases of all the training samples T can be expressed as:

$$\sum_{t=1}^{T} (y_t - y_{training,t})^2 = \sum_{t=1}^{T} (\underline{w}^\dagger \cdot \underline{x}_t + \underline{\omega}^\dagger \cdot \underline{\phi}(\underline{D} \cdot \underline{x}_t) - y_{training,t})^2. \quad (15)$$

The derivative of the sum of the variances of all training samples T with respect to the variables $\underline{\omega}$ then equals:

$$\frac{\partial}{\partial \underline{\omega}} \cdot \left( \sum_{t=1}^{T} \sigma_{y,t}^2 \right) = \frac{\partial}{\partial \underline{\omega}} \cdot \left( \sum_{t=1}^{T} \left( \underline{w}^\dagger + \underline{\omega}^\dagger \cdot \frac{\partial \underline{\phi}(\underline{D} \cdot \underline{x}_t)}{\partial \underline{x}} \right) \cdot \underline{C}_{\underline{x}_t} \cdot \right. \quad (16)$$

$$\left. \left( \underline{w}^\dagger + \underline{\omega}^\dagger \cdot \frac{\partial \underline{\phi}(\underline{D} \cdot \underline{x}_t)}{\partial \underline{x}} \right)^\dagger \right)$$

$$= \sum_{t=1}^{T} \frac{\partial}{\partial \underline{\omega}} \cdot \left( \underline{w}^\dagger + \underline{\omega}^\dagger \cdot \frac{\partial \underline{\phi}(\underline{D} \cdot \underline{x}_t)}{\partial \underline{x}} \right) \cdot \underline{C}_{\underline{x}_t} \cdot$$

$$\left( \underline{w}^\dagger + \underline{\omega}^\dagger \cdot \frac{\partial \underline{\phi}(\underline{D} \cdot \underline{x}_t)}{\partial \underline{x}} \right)^\dagger +$$

-continued $$\sum_{t'=1}^{T}\left(\underline{w}^\dagger + \underline{\omega}^\dagger \cdot \frac{\partial \phi(\underline{D}\cdot\underline{x}_{t'})}{\partial \underline{x}}\right)\cdot \underline{C}_{\underline{x}_{t'}}\cdot \frac{\partial}{\partial \underline{\omega}}\cdot$$

$$\left(\underline{w}^\dagger + \underline{\omega}^\dagger \cdot \frac{\partial \phi(\underline{D}\cdot\underline{x}_{t'})}{\partial \underline{x}}\right)^\dagger$$

$$= \sum_{t=1}^{T}\frac{\partial \phi(\underline{D}\cdot\underline{x}_t)}{\partial \underline{x}}\cdot \underline{C}_{\underline{x}_t}\cdot\left(\underline{w}^\dagger + \underline{\omega}^\dagger\cdot\frac{\partial \phi(\underline{D}\cdot\underline{x}_t)}{\partial \underline{x}}\right)^\dagger +$$

$$\left(\sum_{t'=1}^{T}\left(\underline{w}^\dagger + \underline{\omega}^\dagger\cdot\frac{\partial \phi(\underline{D}\cdot\underline{x}_{t'})}{\partial \underline{x}}\right)\cdot \underline{C}_{\underline{x}_{t'}}\cdot\left(\frac{\partial \phi(\underline{D}\cdot\underline{x}_{t'})}{\partial \underline{x}}\right)^\dagger\right)^\dagger$$

$$= 2\cdot\sum_{t=1}^{T}\frac{\partial \phi(\underline{D}\cdot\underline{x}_t)}{\partial \underline{x}}\cdot \underline{C}_{\underline{x}_t}\cdot\left(\underline{w}^\dagger + \underline{\omega}^\dagger\cdot\frac{\partial \phi(\underline{D}\cdot\underline{x}_t)}{\partial \underline{x}}\right)^\dagger$$

$$= 2\cdot\sum_{t=1}^{T}\frac{\partial \phi(\underline{D}\cdot\underline{x}_t)}{\partial \underline{x}}\cdot \underline{C}_{\underline{x}_t}\cdot\left(\underline{w} + \left(\frac{\partial \phi(\underline{D}\cdot\underline{x}_t)}{\partial \underline{x}}\right)^\dagger\cdot\underline{\omega}\right)$$

$$= 2\cdot\sum_{t=1}^{T}\frac{\partial \phi(\underline{D}\cdot\underline{x}_t)}{\partial \underline{x}}\cdot \underline{C}_{\underline{x}_t}\cdot\left(\frac{\partial \phi(\underline{D}\cdot\underline{x}_t)}{\partial \underline{x}}\right)^\dagger\cdot\underline{\omega} +$$

$$2\cdot\sum_{t'=1}^{T}\frac{\partial \phi(\underline{D}\cdot\underline{x}_{t'})}{\partial \underline{x}}\cdot \underline{C}_{\underline{x}_{t'}}\cdot\underline{w}.$$

In above derivation, use has been made of the fact that the matrix $\underline{C}_x$ is a symmetrical matrix.

The derivative of the sum of the squared biases with respect to the variables $\underline{\omega}$ equals:

$$\frac{\partial}{\partial \underline{\omega}}\cdot\left(\sum_{t=1}^{T}(y_t - y_{training,t})^2\right) = \frac{\partial}{\partial \underline{\omega}}\cdot\sum_{t=1}^{T}(\underline{w}^\dagger\cdot\underline{x}_t + \underline{\omega}^\dagger\cdot\phi(\underline{D}\cdot\underline{x}_t) - y_{training,t})^2 \qquad (17)$$

$$= \sum_{t=1}^{T}\frac{\partial}{\partial \underline{\omega}}\left(\cdot(\underline{w}^\dagger\cdot\underline{x}_t + \underline{\omega}^\dagger\cdot\phi(\underline{D}\cdot\underline{x}_t) - y_{training,t})^2\right)$$

$$= \sum_{t=1}^{T}2\cdot(\underline{w}^\dagger\cdot\underline{x}_t + \underline{\omega}^\dagger\cdot\phi(\underline{D}\cdot\underline{x}_t) - y_{training,t})\cdot$$

$$\frac{\partial}{\partial \underline{\omega}}\cdot(\underline{w}^\dagger\cdot\underline{x}_t + \underline{\omega}^\dagger\cdot\phi(\underline{D}\cdot\underline{x}_t) - y_{training,t})$$

$$= \sum_{t=1}^{T}2\cdot(\underline{w}^\dagger\cdot\underline{x}_t + \underline{\omega}^\dagger\cdot\phi(\underline{D}\cdot\underline{x}_t) - y_{training,t})\cdot$$

$$\frac{\partial}{\partial \underline{\omega}}\cdot(\underline{\omega}^\dagger\cdot\phi(\underline{D}\cdot\underline{x}_t))$$

$$= 2\cdot\sum_{t=1}^{T}(\underline{w}^\dagger\cdot\underline{x}_t + \underline{\omega}^\dagger\cdot\phi(\underline{D}\cdot\underline{x}_t) - y_{training,t})\cdot$$

$$\phi(\underline{D}\cdot\underline{x}_t).$$

Similar to the first embodiment, one can observe that the cost function, i.e.

$$\sum_{t=1}^{T}(y_t - y_{training,t})^2 + \sigma_{y,t}^2,$$

is a quadratic function of the variables $\underline{\omega}$. Hence a sufficient condition of optimality equals $$\frac{\partial}{\partial \underline{\omega}}\cdot\left(\sum_{t=1}^{T}(y_t - y_{training,t})^2 + \sigma_{y,t}^2\right) = \underline{0}.$$

Applying this condition of optimality, using the derivatives as derived in equations (16) and (17), results in:

$$\frac{\partial}{\partial \underline{\omega}}\cdot\left(\sum_{t=1}^{T}(y_t - y_{training,t})^2 + \sigma_{y,t}^2\right) = \underline{0} \qquad (18)$$

$$2\cdot\sum_{t=1}^{T}\frac{\partial \phi(\underline{D}\cdot\underline{x}_t)}{\partial \underline{x}}\cdot \underline{C}_{\underline{x}_t}\cdot\left(\frac{\partial \phi(\underline{D}\cdot\underline{x}_t)}{\partial \underline{x}}\right)^\dagger\cdot\underline{\omega} +$$

$$2\cdot\sum_{t'=1}^{T}\frac{\partial \phi(\underline{D}\cdot\underline{x}_{t'})}{\partial \underline{x}}\cdot \underline{C}_{\underline{x}_{t'}}\cdot\underline{w} +$$

$$2\cdot\sum_{t''=1}^{T}(\underline{w}^\dagger\cdot\underline{x}_{t''} + \underline{\omega}^\dagger\cdot\phi(\underline{D}\cdot\underline{x}_{t''}) - y_{training,t''})\cdot\phi(\underline{D}\cdot\underline{x}_{t''}) = \underline{0}$$

$$\sum_{t=1}^{T}\frac{\partial \phi(\underline{D}\cdot\underline{x}_t)}{\partial \underline{x}}\cdot \underline{C}_{\underline{x}_t}\cdot\left(\frac{\partial \phi(\underline{D}\cdot\underline{x}_t)}{\partial \underline{x}}\right)^\dagger\cdot\underline{\omega} + \sum_{t'=1}^{T}\frac{\partial \phi(\underline{D}\cdot\underline{x}_{t'})}{\partial \underline{x}}\cdot \underline{C}_{\underline{x}_{t'}}\cdot\underline{w} +$$

$$\sum_{t''=1}^{T}(\underline{w}^\dagger\cdot\underline{x}_{t''} + \underline{\omega}^\dagger\cdot\phi(\underline{D}\cdot\underline{x}_{t''}) - y_{training,t''})\cdot\phi(\underline{D}\cdot\underline{x}_{t''}) = \underline{0}$$

$$\sum_{t=1}^{T}\frac{\partial \phi(\underline{D}\cdot\underline{x}_t)}{\partial \underline{x}}\cdot \underline{C}_{\underline{x}_t}\cdot\left(\frac{\partial \phi(\underline{D}\cdot\underline{x}_t)}{\partial \underline{x}}\right)^\dagger\cdot\underline{\omega} +$$

$$\sum_{t'=1}^{T}\underline{\omega}^\dagger\cdot\phi(\underline{D}\cdot\underline{x}_{t'})\cdot\phi(\underline{D}\cdot\underline{x}_{t'}) =$$

$$\sum_{t''=1}^{T}(y_{training,t''} - \underline{w}^\dagger\cdot\underline{x}_{t''})\cdot\phi(\underline{D}\cdot\underline{x}_{t''}) - \sum_{t'''=1}^{T}\left(\frac{\partial \phi(\underline{D}\cdot\underline{x}_{t'''})}{\partial \underline{x}}\right)\cdot\underline{C}_{\underline{x}_{t''}}\cdot\underline{w}$$

$$\left(\sum_{t=1}^{T}\frac{\partial \phi(\underline{D}\cdot\underline{x}_t)}{\partial \underline{x}}\cdot \underline{C}_{\underline{x}_t}\cdot\left(\frac{\partial \phi(\underline{D}\cdot\underline{x}_t)}{\partial \underline{x}}\right)^\dagger + \sum_{t'=1}^{T}\phi(\underline{D}\cdot\underline{x}_{t'})\cdot\phi^\dagger(\underline{D}\cdot\underline{x}_{t'})\right)\cdot\underline{\omega} =$$

$$\sum_{t''=1}^{T}\phi(\underline{D}\cdot\underline{x}_{t''})\cdot(y_{training,t''} - \underline{w}^\dagger\cdot\underline{x}_{t''}) - \sum_{t'''=1}^{T}\frac{\partial \phi(\underline{D}\cdot\underline{x}_{t'''})}{\partial \underline{x}}\cdot\underline{C}_{\underline{x}_{t''}}\cdot\underline{w}.$$

The optimal values of the variables $\underline{\omega}$ can now be computed by solving this linear system of equations (17).

As an example of the basis-functions as applied in above equations, the use of radial basis functions can be mentioned. Referring to equation (12), the following radial basis functions can be used in the corrector:

$$\phi(\underline{D}\cdot x) = \begin{bmatrix} \exp\left(-\|\underline{\gamma}\cdot\underline{D}\cdot(x-\underline{\xi}_{s=1})\|_2^2\right) \\ \exp\left(-\|\underline{\gamma}\cdot\underline{D}\cdot(x-\underline{\xi}_{s=2})\|_2^2\right) \\ \vdots \\ \exp\left(-\|\underline{\gamma}\cdot\underline{D}\cdot(x-\underline{\xi}_{s=S})\|_2^2\right) \end{bmatrix} \quad (19)$$

Where $S \in (1, 2, 3, \ldots)$ denotes the number of support vectors that is used.

Where $\underline{\xi}_{s=1,\ldots,S}$ denote the S support vectors, the support vectors defining the position at which the radial basis function is positioned.

Where:

$\underline{\gamma} \in \{\underline{\gamma} \in \mathbb{R}^{M\times M}:(\gamma)_{r,c}\geq 0,\text{ for all } r \text{ and } c\}$ denotes the radial basis function radius scaling (non-negative) matrix.

With respect to the scaling, it can be mentioned that the scaling may be defined in such manner that the model results in a good approximation of the optimal response surface. The scaling as applied may e.g. be predetermined or may be optimized using an outer optimization loop.

The radial basis functions as expressed by equation (19) are Gaussian or exponential radial basis functions.

In case the radial basis functions are used, the required derivatives can be calculated as follows:

$$\frac{\partial \phi(\underline{D}\cdot x)}{\partial x} = \frac{\partial}{\partial x} \cdot \begin{bmatrix} \exp\left(-\|\underline{\gamma}\cdot\underline{D}\cdot(x-\underline{\xi}_{s=1})\|_2^2\right) \\ \exp\left(-\|\underline{\gamma}\cdot\underline{D}\cdot(x-\underline{\xi}_{s=2})\|_2^2\right) \\ \vdots \\ \exp\left(-\|\underline{\gamma}\cdot\underline{D}\cdot(x-\underline{\xi}_{s=S})\|_2^2\right) \end{bmatrix} \quad (20)$$

$$= \begin{bmatrix} \left(\frac{\partial}{\partial x}\cdot\exp\left(-\|\underline{\gamma}\cdot\underline{D}\cdot(x-\underline{\xi}_{s=1})\|_2^2\right)\right)^\dagger \\ \left(\frac{\partial}{\partial x}\cdot\exp\left(-\|\underline{\gamma}\cdot\underline{D}\cdot(x-\underline{\xi}_{s=2})\|_2^2\right)\right)^\dagger \\ \vdots \\ \left(\frac{\partial}{\partial x}\cdot\exp\left(-\|\underline{\gamma}\cdot\underline{D}\cdot(x-\underline{\xi}_{s=S})\|_2^2\right)\right)^\dagger \end{bmatrix}$$

$$= \begin{bmatrix} \exp\left(-\|\underline{\gamma}\cdot\underline{D}\cdot(x-\underline{\xi}_{s=1})\|_2^2\right)\cdot\left(\frac{\partial}{\partial x}\cdot\left(-\|\underline{\gamma}\cdot\underline{D}\cdot(x-\underline{\xi}_{s=1})\|_2^2\right)\right)^\dagger \\ \exp\left(-\|\underline{\gamma}\cdot\underline{D}\cdot(x-\underline{\xi}_{s=2})\|_2^2\right)\cdot\left(\frac{\partial}{\partial x}\cdot\left(-\|\underline{\gamma}\cdot\underline{D}\cdot(x-\underline{\xi}_{s=2})\|_2^2\right)\right)^\dagger \\ \vdots \\ \exp\left(-\|\underline{\gamma}\cdot\underline{D}\cdot(x-\underline{\xi}_{s=S})\|_2^2\right)\cdot\left(\frac{\partial}{\partial x}\cdot\left(-\|\underline{\gamma}\cdot\underline{D}\cdot(x-\underline{\xi}_{s=S})\|_2^2\right)\right)^\dagger \end{bmatrix}$$

Whereby:

$$\frac{\partial}{\partial x}\cdot\left(-\|\underline{\gamma}\cdot\underline{D}\cdot(x-\underline{\xi})\|_2^2\right) = 1\cdot\frac{\partial}{\partial x}\cdot\left((x-\underline{\xi})^\dagger\cdot\underline{D}^\dagger\cdot\underline{\gamma}^\dagger\cdot\underline{\gamma}\cdot\underline{D}\cdot(x-\underline{\xi})\right) = \quad (21)$$

$$-1\cdot\left(\frac{\partial((x-\underline{\xi})^\dagger)}{\partial x}\cdot\underline{D}^\dagger\cdot\underline{\gamma}^\dagger\cdot\underline{\gamma}\cdot\underline{D}\cdot(x-\underline{\xi}) + (x-\underline{\xi})^\dagger\cdot\underline{D}^\dagger\cdot\underline{\gamma}^\dagger\cdot\underline{\gamma}\cdot\underline{D}\cdot\frac{\partial(x-\underline{\xi})}{\partial x}\right) =$$

$$-2\cdot\underline{D}^\dagger\cdot\underline{\gamma}^\dagger\cdot\underline{\gamma}\cdot\underline{D}\cdot(x-\underline{\xi}).$$

Inserting equation (21) in equation (20) results in:

$$\frac{\partial\phi(\underline{D}\cdot x)}{\partial x} = \begin{bmatrix} \exp\left(-\|\underline{\gamma}\cdot\underline{D}\cdot(x-\underline{\xi}_{s=1})\|_2^2\right)\cdot\left(-2\cdot\gamma^2\cdot\underline{D}^\dagger\cdot\underline{\gamma}^\dagger\cdot\underline{\gamma}\cdot\underline{D}\cdot(x-\underline{\xi}_{s=1})\right)^\dagger \\ \exp\left(-\|\underline{\gamma}\cdot\underline{D}\cdot(x-\underline{\xi}_{s=2})\|_2^2\right)\cdot\left(-2\cdot\gamma^2\cdot\underline{D}^\dagger\cdot\underline{\gamma}^\dagger\cdot\underline{\gamma}\cdot\underline{D}\cdot(x-\underline{\xi}_{s=2})\right)^\dagger \\ \vdots \\ \exp\left(-\|\underline{\gamma}\cdot\underline{D}\cdot(x-\underline{\xi}_{s=S})\|_2^2\right)\cdot\left(-2\cdot\gamma^2\cdot\underline{D}^\dagger\cdot\underline{\gamma}^\dagger\cdot\underline{\gamma}\cdot\underline{D}\cdot(x-\underline{\xi}_{s=S})\right)^\dagger \end{bmatrix} \quad (22)$$

$$= -2\cdot\begin{bmatrix} \exp\left(-\|\underline{\gamma}\cdot\underline{D}\cdot(x-\underline{\xi}_{s=1})\|_2^2\right)\cdot\left(\underline{D}^\dagger\cdot\underline{\gamma}^\dagger\cdot\underline{\gamma}\cdot\underline{D}\cdot(x-\underline{\xi}_{s=1})\right)^\dagger \\ \exp\left(-\|\underline{\gamma}\cdot\underline{D}\cdot(x-\underline{\xi}_{s=2})\|_2^2\right)\cdot\left(\underline{D}^\dagger\cdot\underline{\gamma}^\dagger\cdot\underline{\gamma}\cdot\underline{D}\cdot(x-\underline{\xi}_{s=2})\right)^\dagger \\ \vdots \\ \exp\left(-\|\underline{\gamma}\cdot\underline{D}\cdot(x-\underline{\xi}_{s=S})\|_2^2\right)\cdot\left(\underline{D}^\dagger\cdot\underline{\gamma}^\dagger\cdot\underline{\gamma}\cdot\underline{D}\cdot(x-\underline{\xi}_{s=S})\right)^\dagger \end{bmatrix}$$

-continued $$= -2 \cdot \begin{bmatrix} \exp(-\|\underline{\gamma} \cdot \underline{D} \cdot (x - \underline{\xi}_{s=1})\|_2^2) \cdot (x - \underline{\xi}_{s=1})^\dagger \underline{D}^\dagger \cdot \underline{\gamma}^\dagger \cdot \underline{\gamma} \cdot \underline{D} \\ \exp(-\|\underline{\gamma} \cdot \underline{D} \cdot (x - \underline{\xi}_{s=2})\|_2^2) \cdot (x - \underline{\xi}_{s=2})^\dagger \underline{D}^\dagger \cdot \underline{\gamma}^\dagger \cdot \underline{\gamma} \cdot \underline{D} \\ \vdots \\ \exp(-\|\underline{\gamma} \cdot \underline{D} \cdot (x - \underline{\xi}_{s=S})\|_2^2) \cdot (x - \underline{\xi}_{s=S})^\dagger \cdot \underline{D}^\dagger \cdot \underline{\gamma}^\dagger \cdot \underline{\gamma} \cdot \underline{D} \end{bmatrix}$$

$$= -2 \cdot \operatorname{diag}(\phi(\underline{D} \cdot x)) \cdot \begin{bmatrix} (x - \underline{\xi}_{s=1})^\dagger \\ (x - \underline{\xi}_{s=2})^\dagger \\ \vdots \\ (x - \underline{\xi}_{s=S})^\dagger \end{bmatrix} \cdot \underline{D}^\dagger \cdot \underline{\gamma}^\dagger \cdot \underline{\gamma} \cdot \underline{D}.$$

In an embodiment, the corrector part may make use of any further or additional information available with respect to the simulated measurements or the measurements that are used as samples. As an example, in a third embodiment, the corrector part of the alignment position estimator includes so-called pupil intensity information.

In such embodiment, the the combination of the predictor and corrector of the alignment position estimator can be set equal to $$y = \underline{w}^\dagger \cdot x + \underline{\omega}^\dagger \cdot \phi\left(\begin{bmatrix} x - \underline{w}^\dagger \cdot x \\ \underline{I} \end{bmatrix}\right) \quad (23)$$

$$= \underline{w}^\dagger \cdot x + \underline{\omega}^\dagger \cdot \phi\left(\begin{bmatrix} \underline{D} \cdot x \\ \underline{I} \end{bmatrix}\right).$$

Whereby the exponential radial basis function is redefined to equal:

$$\phi\left(\begin{bmatrix} \underline{D} \cdot x \\ \underline{I} \end{bmatrix}\right) = \begin{bmatrix} \exp\left(-\left\|\begin{bmatrix} \underline{\gamma}_x \cdot \underline{D} \cdot (x - \underline{\xi}_{s=1}) \\ \underline{\gamma}_I \cdot (I - \vartheta_{s=1}) \end{bmatrix}\right\|_2^2\right) \\ \exp\left(-\left\|\begin{bmatrix} \underline{\gamma}_x \cdot \underline{D} \cdot (x - \underline{\xi}_{s=2}) \\ \underline{\gamma}_I \cdot (I - \vartheta_{s=2}) \end{bmatrix}\right\|_2^2\right) \\ \vdots \\ \exp\left(-\left\|\begin{bmatrix} \underline{\gamma}_x \cdot \underline{D} \cdot (x - \underline{\xi}_{s=S}) \\ \underline{\gamma}_I \cdot (I - \vartheta_{s=S}) \end{bmatrix}\right\|_2^2\right) \end{bmatrix} \quad (24)$$

Where:
$\underline{I}$ is a N×1 vector denoting the pupil intensity information measured by the alignment sensor, for all wavelength, polarization, diffraction order and/or illumination angle combinations;
$N \in \{1, 2, 3, \ldots\}$ denotes the total number of wavelength, polarization, diffraction order and/or illumination angle combinations, of the pupil intensity information measured by the alignment sensor;
$\underline{\gamma}_x \in \{\underline{\gamma} \in \mathbb{R}^{M \times M} : (\underline{\gamma})_{r,c} \geq 0, \text{ for all } r \text{ and } c\}$ denotes the radial basis function radius scaling (non-negative) matrix, for the position part;
$\underline{\gamma}_I \in \{\underline{\gamma} \in \mathbb{R}^{M \times M} : (\underline{\gamma})_{r,c} \leq 0, \text{ for all } r \text{ and } c\}$ denotes the radial basis function radius scaling (non-negative) matrix, for the intensity part;
As can be seen from equation (23), the corrector part of the alignment position estimator also includes the corrector part of the second embodiment. It should however be noted that it is not required to combine both. The pupil intensity information may also be used separately, i.e. without the corrector portion of the second embodiment.

When doing so, the alignment position estimator would become:

$$y = \underline{w}^t \cdot x + \underline{\omega}^t \cdot \phi(\underline{I}) \quad (25)$$

Equation (25) can be considered a fourth embodiment of alignment position estimator.

With respect to the pupil intensity information referred to above, the following can be mentioned: in case an alignment sensor is configured such that intensities of certain diffraction orders can be measured in a pupil plane of the sensor, this information can be used to provide in an improved estimate of the aligned position.

Figure 6:
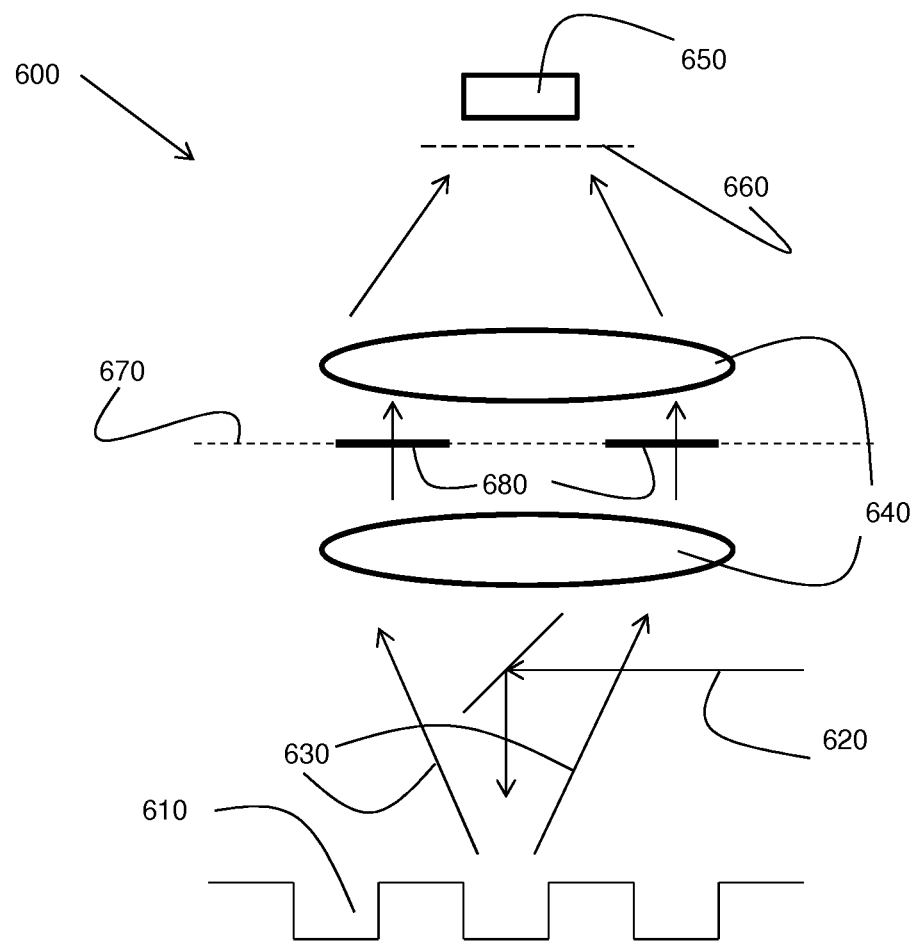
FIG. 6 depicts an alignment system enabling asymmetrical measurements.

FIG. 6 schematically illustrates an alignment sensor whereby pupil plane intensity measurements can be performed. FIG. 6 schematically shows an alignment system 600 configured to determine a position of an alignment mark 610, by projecting an alignment beam 620 onto the alignment mark 610. The reflected beam or beams 630 are subsequently provided, via a lens system 640 to a detector 650, e.g. via a grating 660 or the like. Based on the intensity as detected by the detector 650, a relative position of the alignment mark 610 and the grating 660 or detector 650 of the alignment system 600.

FIG. 6 further schematically shows a pupil plane 670 of the lens system 630 and two locations 680 at which an intensity of the reflected beam or beams 630 can be measured. In an embodiment, the locations may be selected to enable measurement of the −1 and +1 order of the reflected beam 630. Alternatively or in addition, higher order components of the reflected measurement beams may be measured as well.

It has been observed by the inventors that, in case the alignment mark 610 as measured is deformed, e.g. comprising a deformation as shown in FIGS. 4(b) 4(c), an asymmetry may be observed between the intensity as measured at the different locations, e.g. locations 680, in the pupil plane of the alignment sensor. Such asymmetry measurement, e.g. providing in a difference between an observed intensity of a +1 reflected order and a −1 reflected order, provides in additional information regarding the occurring mark deformations.

This pupil intensity information can be applied in a similar manner as describe above with respect to the simulated alignment measurements.

In particular, simulations of alignment measurements can be applied, as described above, to provide in an estimate of an aligned position when actual alignment measurements are made, using the same or nearly the same measurement parameters or characteristics as applied in the simulations.

Similarly, in case pupil plane intensities can be measured by an alignment sensor, such pupil plane intensities may be simulated as well, using a plurality of simulated parameters $\lambda$, and weight coefficients can be sought such that a weighted combination of the pupil plane intensities, as measured using the same plurality of characteristics or parameters $\lambda$ during an actual alignment process, can be used as an improved (or corrected) estimate of the aligned position.

As such, assuming that a particular set of pupil intensity information can be obtained by an alignment sensor, the same intensity information may be retrieved by simulations.

In particular, the same set of T samples may be used and the pupil intensity information (e.g. the difference between an observed intensity of a +1 reflected order and a −1 reflected order in a pupil plane) may be obtained from these models, for a plurality of simulation parameters $\lambda$.

When this information is available, a cost function can be defined that is to be optimized.

In order to obtain the weight coefficients $\underline{\omega}$ as applied in the alignment position estimator of equation (23), a similar cost function is applied as the second example cost function as applied in the first embodiment of the alignment position estimator, i.e. a cost function including the sum of all training sample variances and the sum of all training sample squared biases.

Note that, similar to the equations (6) and (13), the variance of y (as expressed in equation (23)) can be expressed as a function of the covariance matrix of $\underline{x}$, as follows:

$$\sigma_y^2 = \frac{\partial}{\partial \underline{x}} \cdot \left( \underline{w}^\dagger \cdot \underline{x} + \underline{\omega}^\dagger \cdot \phi\left( \left[ \frac{\underline{x} - \underline{w}^\dagger \cdot \underline{x}}{\underline{l}} \right] \right) \right) \cdot \tag{26}$$

$$\underline{\underline{C}}_{\underline{x}} \cdot \left( \frac{\partial}{\partial \underline{x}} \cdot \left( \underline{w}^\dagger \cdot \underline{x} + \underline{\omega}^\dagger \cdot \phi\left( \left[ \frac{\underline{x} - \underline{w}^\dagger \cdot \underline{x}}{\underline{l}} \right] \right) \right) \right)^\dagger +$$

$$\frac{\partial}{\partial \underline{l}} \cdot \left( \underline{w}^\dagger \cdot \underline{x} + \underline{\omega}^\dagger \cdot \phi\left( \left[ \frac{\underline{x} - \underline{w}^\dagger \cdot \underline{x}}{\underline{l}} \right] \right) \right) \cdot \underline{\underline{C}}_{\underline{l}} \cdot$$

$$\left( \frac{\partial}{\partial \underline{l}} \cdot \left( \underline{w}^\dagger \cdot \underline{x} + \underline{\omega}^\dagger \cdot \phi\left( \left[ \frac{\underline{x} - \underline{w}^\dagger \cdot \underline{x}}{\underline{l}} \right] \right) \right) \right)^\dagger =$$

$$\left( \underline{w}^\dagger + \underline{\omega}^\dagger \cdot \frac{\partial \phi\left( \left[ \frac{\underline{x} - \underline{w}^\dagger \cdot \underline{x}}{\underline{l}} \right] \right)}{\partial \underline{x}} \right) \cdot \underline{\underline{C}}_{\underline{x}} \cdot$$

$$\left( \underline{w}^\dagger + \underline{\omega}^\dagger \cdot \frac{\partial \phi\left( \left[ \frac{\underline{x} - \underline{w}^\dagger \cdot \underline{x}}{\underline{l}} \right] \right)}{\partial \underline{x}} \right)^\dagger +$$

$$\underline{\omega}^\dagger \cdot \frac{\partial \phi\left( \left[ \frac{\underline{x} - \underline{w}^\dagger \cdot \underline{x}}{\underline{l}} \right] \right)}{\partial \underline{l}} \cdot \underline{\underline{C}}_{\underline{l}} \cdot \left( \underline{\omega}^\dagger \cdot \frac{\partial \phi\left( \left[ \frac{\underline{x} - \underline{w}^\dagger \cdot \underline{x}}{\underline{l}} \right] \right)}{\partial \underline{l}} \right)^\dagger =$$

$$\left( \underline{w}^\dagger + \underline{\omega}^\dagger \cdot \frac{\partial \phi\left( \left[ \frac{\underline{D} \cdot \underline{x}}{\underline{l}} \right] \right)}{\partial \underline{x}} \right) \cdot \underline{\underline{C}}_{\underline{x}} \cdot \left( \underline{w}^\dagger + \underline{\omega}^\dagger \cdot \frac{\partial \phi\left( \left[ \frac{\underline{D} \cdot \underline{x}}{\underline{l}} \right] \right)}{\partial \underline{x}} \right)^\dagger +$$

$$\underline{\omega}^\dagger \cdot \frac{\partial \phi\left( \left[ \frac{\underline{D} \cdot \underline{x}}{\underline{l}} \right] \right)}{\partial \underline{l}} \cdot \underline{\underline{C}}_{\underline{l}} \cdot \left( \underline{\omega}^\dagger \cdot \frac{\partial \phi\left( \left[ \frac{\underline{D} \cdot \underline{x}}{\underline{l}} \right] \right)}{\partial \underline{l}} \right)^\dagger.$$

For this derivation, it has been assumed here that $\underline{x}$ and $\underline{l}$ are statistically uncorrelated. Applying equation (26) to derive the sum of all training sample variances results in:

$$\sum_{t=1}^{T} \sigma_{y,t}^2 = \tag{27}$$

$$\sum_{t=1}^{T} \left( \underline{w}^\dagger + \underline{\omega}^\dagger \cdot \frac{\partial \phi\left( \left[ \frac{\underline{D} \cdot \underline{x}_t}{\underline{l}_t} \right] \right)}{\partial \underline{x}} \right) \cdot \underline{\underline{C}}_{\underline{x}_t} \cdot \left( \underline{w}^\dagger + \underline{\omega}^\dagger \cdot \frac{\partial \phi\left( \left[ \frac{\underline{D} \cdot \underline{x}_t}{\underline{l}_t} \right] \right)}{\partial \underline{x}} \right)^\dagger +$$

$$\sum_{t'=1}^{T} \underline{\omega}^\dagger \cdot \frac{\partial \phi\left( \left[ \frac{\underline{D} \cdot \underline{x}_{t'}}{\underline{l}_{t'}} \right] \right)}{\partial \underline{l}} \cdot \underline{\underline{C}}_{\underline{l}_{t'}} \cdot \left( \underline{\omega}^\dagger \cdot \frac{\partial \phi\left( \left[ \frac{\underline{D} \cdot \underline{x}_{t'}}{\underline{l}_{t'}} \right] \right)}{\partial \underline{l}} \right)^\dagger.$$

Further, the sum of all training sample squared biases for the alignment position estimator of equation (23) equals:

$$\sum_{t=1}^{T} (y_t - y_{training,t})^2 = \sum_{t=1}^{T} \left( \underline{w}^\dagger \cdot \underline{x}_t + \underline{\omega}^\dagger \cdot \phi\left( \left[ \frac{\underline{D} \cdot \underline{x}_t}{\underline{l}_t} \right] \right) - y_{training,t} \right)^2 \tag{28}$$

In a similar manner as above, the optimum of cost function is found by equating the sum of the derivatives of the sum of all training sample squared biases and of the sum of all training sample variances with respect to the variables $\underline{\omega}$ to zero.

The derivative of the sum of all training sample variances with respect to the variables $\underline{\omega}$ equals:

$$\frac{\partial}{\partial \underline{\omega}} \cdot \left( \sum_{t=1}^{T} \sigma_{y,t}^2 \right) = \tag{29}$$

$$\frac{\partial}{\partial \underline{\omega}} \cdot \left\{ \begin{array}{l} \sum_{t=1}^{T} \left( \underline{w}^\dagger + \underline{\omega}^\dagger \cdot \frac{\partial \phi\left( \left[ \frac{\underline{D} \cdot \underline{x}_t}{\underline{l}_t} \right] \right)}{\partial \underline{x}} \right) \cdot \underline{\underline{C}}_{\underline{x}_t} \cdot \\ \left( \underline{w}^\dagger + \underline{\omega}^\dagger \cdot \frac{\partial \phi\left( \left[ \frac{\underline{D} \cdot \underline{x}_t}{\underline{l}_t} \right] \right)}{\partial \underline{x}} \right)^\dagger + \\ \sum_{t'=1}^{T} \underline{\omega}^\dagger \cdot \frac{\partial \phi\left( \left[ \frac{\underline{D} \cdot \underline{x}_{t'}}{\underline{l}_{t'}} \right] \right)}{\partial \underline{l}} \cdot \underline{\underline{C}}_{\underline{l}_{t'}} \cdot \left( \underline{\omega}^\dagger \cdot \frac{\partial \phi\left( \left[ \frac{\underline{D} \cdot \underline{x}_{t'}}{\underline{l}_{t'}} \right] \right)}{\partial \underline{l}} \right)^\dagger \end{array} \right\} =$$

$$2 \cdot \sum_{t=1}^{T} \frac{\partial \phi\left( \left[ \frac{\underline{D} \cdot \underline{x}_t}{\underline{l}_t} \right] \right)}{\partial \underline{x}} \cdot \underline{\underline{C}}_{\underline{x}_t} \cdot \left( \frac{\partial \phi\left( \left[ \frac{\underline{D} \cdot \underline{x}_t}{\underline{l}_t} \right] \right)}{\partial \underline{x}} \right)^\dagger \cdot \underline{\omega} +$$

$$2 \cdot \sum_{t'=1}^{T} \frac{\partial \phi\left( \left[ \frac{\underline{D} \cdot \underline{x}_{t'}}{\underline{l}_{t'}} \right] \right)}{\partial \underline{x}} \cdot \underline{\underline{C}}_{\underline{x}_{t'}} \cdot \underline{w} +$$

$$2 \cdot \sum_{t''=1}^{T} \frac{\partial \phi\left(\begin{bmatrix} \underline{D} \cdot \underline{x}_{t''} \\ \underline{I}_{t''} \end{bmatrix}\right)}{\partial \underline{I}} \cdot \underline{\underline{C}}_{\underline{I}_{t''}} \cdot \left(\frac{\partial \phi\left(\begin{bmatrix} \underline{D} \cdot \underline{x}_{t''} \\ \underline{I}_{t''} \end{bmatrix}\right)}{\partial \underline{I}}\right)^{\dagger} \cdot \underline{\omega}.$$

Note that we have made use of the fact that the matrix $\underline{\underline{C}}_{\underline{x}_{t'}}$ is a symmetrical matrix.

The derivative of the sum of all squared biases with respect to the variables $\underline{\omega}$ equals $$\frac{\partial}{\partial \underline{\omega}} \cdot \left( \sum_{t=1}^{T} (y_t - y_{training,t})^2 \right) = \quad (30)$$

$$\frac{\partial}{\partial \underline{\omega}} \cdot \sum_{t=1}^{T} \left( \underline{w}^{\dagger} \cdot \underline{x}_t + \underline{\omega}^{\dagger} \cdot \phi\left(\begin{bmatrix} \underline{D} \cdot \underline{x}_t \\ \underline{I}_t \end{bmatrix}\right) - y_{training,t} \right)^2 =$$

$$2 \cdot \sum_{t=1}^{T} \left( \underline{w}^{\dagger} \cdot \underline{x}_t + \underline{\omega}^{\dagger} \cdot \phi\left(\begin{bmatrix} \underline{D} \cdot \underline{x}_t \\ \underline{I}_t \end{bmatrix}\right) - y_{training,t} \right) \cdot \phi\left(\begin{bmatrix} \underline{D} \cdot \underline{x}_t \\ \underline{I}_t \end{bmatrix}\right).$$

Using the derivatives as computed in equations (29) and (30), the condition of optimality for the cost function becomes:

$$\frac{\partial}{\partial \underline{\omega}}\left( \sum_{t=1}^{T} (y_t - y_{training,t})^2 + \sigma_{y,t}^2 \right) = \underline{0} \quad (31)$$

$$\begin{cases} 2 \cdot \sum_{t=1}^{T} \frac{\partial \phi\left(\begin{bmatrix} \underline{D} \cdot \underline{x}_t \\ \underline{I}_t \end{bmatrix}\right)}{\partial \underline{x}} \cdot \underline{\underline{C}}_{\underline{x}_t} \cdot \left(\frac{\partial \phi\left(\begin{bmatrix} \underline{D} \cdot \underline{x}_t \\ \underline{I}_t \end{bmatrix}\right)}{\partial \underline{x}}\right)^{\dagger} \cdot \underline{\omega} + \\ 2 \cdot \sum_{t'=1}^{T} \frac{\partial \phi\left(\begin{bmatrix} \underline{D} \cdot \underline{x}_{t'} \\ \underline{I}_{t'} \end{bmatrix}\right)}{\partial \underline{x}} \cdot \underline{\underline{C}}_{\underline{x}_{t'}} \cdot \underline{w} + \\ 2 \cdot \sum_{t''=1}^{T} \frac{\partial \phi\left(\begin{bmatrix} \underline{D} \cdot \underline{x}_{t''} \\ \underline{I}_{t''} \end{bmatrix}\right)}{\partial \underline{I}} \cdot \underline{\underline{C}}_{\underline{I}_{t''}} \cdot \left(\frac{\partial \phi\left(\begin{bmatrix} \underline{D} \cdot \underline{x}_{t''} \\ \underline{I}_{t''} \end{bmatrix}\right)}{\partial \underline{I}}\right)^{\dagger} \cdot \underline{\omega} + \\ 2 \cdot \sum_{t''=1}^{T} \left( \underline{w}^{\dagger} \cdot \underline{x}_{t''} + \underline{\omega}^{\dagger} \cdot \phi\left(\begin{bmatrix} \underline{D} \cdot \underline{x}_{t''} \\ \underline{I}_{t''} \end{bmatrix}\right) - y_{training,t''} \right) \cdot \\ \phi\left(\begin{bmatrix} \underline{D} \cdot \underline{x}_{t''} \\ \underline{I}_{t''} \end{bmatrix}\right) \end{cases} = \underline{0}$$

$$\begin{cases} \sum_{t=1}^{T} \frac{\partial \phi\left(\begin{bmatrix} \underline{D} \cdot \underline{x}_t \\ \underline{I}_t \end{bmatrix}\right)}{\partial \underline{x}} \cdot \underline{\underline{C}}_{\underline{x}_t} \cdot \left(\frac{\partial \phi\left(\begin{bmatrix} \underline{D} \cdot \underline{x}_t \\ \underline{I}_t \end{bmatrix}\right)}{\partial \underline{x}}\right)^{\dagger} + \\ \sum_{t'=1}^{T} \frac{\partial \phi\left(\begin{bmatrix} \underline{D} \cdot \underline{x}_{t'} \\ \underline{I}_{t'} \end{bmatrix}\right)}{\partial \underline{I}} \cdot \underline{\underline{C}}_{\underline{I}_{t'}} \cdot \left(\frac{\partial \phi\left(\begin{bmatrix} \underline{D} \cdot \underline{x}_{t'} \\ \underline{I}_{t'} \end{bmatrix}\right)}{\partial \underline{I}}\right)^{\dagger} + \\ \sum_{t''=1}^{T} \phi\left(\begin{bmatrix} \underline{D} \cdot \underline{x}_{t''} \\ \underline{I}_{t''} \end{bmatrix}\right) \cdot \phi^{\dagger}\left(\begin{bmatrix} \underline{D} \cdot \underline{x}_{t''} \\ \underline{I}_{t''} \end{bmatrix}\right) \end{cases} \cdot \underline{\omega} =$$

$$\begin{pmatrix} \sum_{t=1}^{T} \phi\left(\begin{bmatrix} \underline{D} \cdot \underline{x}_t \\ \underline{I}_t \end{bmatrix}\right) \cdot (y_{training,t} - \underline{w}^{\dagger} \cdot \underline{x}_t) - \\ \sum_{t'=1}^{T} \frac{\partial \phi\left(\begin{bmatrix} \underline{D} \cdot \underline{x}_{t'} \\ \underline{I}_{t'} \end{bmatrix}\right)}{\partial \underline{x}} \cdot \underline{\underline{C}}_{\underline{x}_{t'}} \cdot \underline{w} \end{pmatrix}.$$

As can be seen, equation (31) now includes the pupil intensity information $\underline{I}$. The following derivatives, whereby exponential radial basis functions are applied as the basis functions, are however straightforward to derive, in a similar manner as in equation (22). Therefore, only the result is presented here:

$$\frac{\partial \phi\left(\begin{bmatrix} \underline{D} \cdot \underline{x} \\ \underline{I} \end{bmatrix}\right)}{\partial \underline{x}} = -2 \cdot \text{diag}\left(\phi\left(\begin{bmatrix} \underline{D} \cdot \underline{x} \\ \underline{I} \end{bmatrix}\right)\right) \cdot \begin{bmatrix} (\underline{x} - \underline{\xi}_{s=1})^{\dagger} \\ (\underline{x} - \underline{\xi}_{s=2})^{\dagger} \\ M \\ (\underline{x} - \underline{\xi}_{s=S})^{\dagger} \end{bmatrix} \cdot \underline{D}^{\dagger} \cdot \underline{\underline{\gamma}}_{\underline{x}}^{\dagger} \cdot \underline{\underline{\gamma}}_{\underline{x}} \cdot \underline{D} \quad (31)$$

Similarly, the derivative with respect to the pupil intensity information $\underline{I}$ can be found as:

$$\frac{\partial \phi\left(\begin{bmatrix} \underline{D} \cdot \underline{x} \\ \underline{I} \end{bmatrix}\right)}{\partial \underline{I}} = -2 \cdot \text{diag}\left(\phi\left(\begin{bmatrix} \underline{D} \cdot \underline{x} \\ \underline{I} \end{bmatrix}\right)\right) \cdot \begin{bmatrix} (I - \vartheta_{s=1})^{\dagger} \\ (I - \vartheta_{s=2})^{\dagger} \\ M \\ (I - \vartheta_{s=S})^{\dagger} \end{bmatrix} \cdot \underline{\underline{\gamma}}_I^{\dagger} \cdot \underline{\underline{\gamma}}_I \quad (32)$$

Using any of the embodiments as described above, optimal weight coefficients $\underline{w}$ or a combination of optimal weight coefficients $\underline{w}$ and optimal weight coefficients $\underline{\omega}$ can be derived.

Once derived, these weight coefficients may subsequently be used online, i.e. during operation of a lithographic apparatus, to determine a position of an alignment mark as a weighted combination of measurements performed on that alignment mark, whereby the measurements include position measurements (using a plurality of alignment measurement parameters or characteristics λ) and optionally include pupil plane intensity measurements.

The following overview summarizes the forms of the alignment position estimators as described in the various embodiments:

$$y = \underline{w}^\dagger \cdot \underline{x} \quad (1)$$

$$y = \underline{w}^\dagger \cdot \underline{x} + \underline{\omega}^\dagger \cdot \underline{\phi}(\underline{x} - \underline{w}^\dagger \cdot \underline{x}) \quad (12)$$
$$= \underline{w}^\dagger \cdot \underline{x} + \underline{\omega}^\dagger \cdot \underline{\phi}(\underline{D} \cdot \underline{x}).$$

$$y = \underline{w}^\dagger \cdot \underline{x} + \underline{\omega}^\dagger \cdot \underline{\phi}\left(\frac{\underline{x} - \underline{w}^\dagger \cdot \underline{x}}{L}\right) \quad (23)$$
$$= \underline{w}^\dagger \cdot \underline{x} + \underline{\omega}^\dagger \cdot \underline{\phi}\left(\frac{\underline{D} \cdot \underline{x}}{L}\right).$$

$$y = \underline{w}^t \cdot \underline{x} + \underline{\omega}^t \cdot \underline{\phi}(L) \quad (25)$$

In order to determine the weight coefficients as used in the alignment position estimators, use is made of a cost function that is optimized, whereby the cost function is a function based on simulated data of the alignment process, using a plurality of models or training samples T. In the above, two examples have been given, i.e.
  a cost function including the sum, over all samples T, of the squared biases of the simulations and;
  a cost function including the sum, over all samples T, of the squared biases and the sum, over all samples T, of the variances, of the simulations.

Both cost functions may be applied in either of the alignment position estimators to determine either the weight coefficients w, the weight coefficients ω or both. With respect to the latter cost function, it is worth mentioning that either the sum, over all samples T, of the squared biases or the sum, over all samples T, of the variances, or both may be weighted as well.

The aligned position estimators in equations (12), (23) and (25) make use of basis-functions. As an example, the use of exponential radial basis functions is described. However, it should be noted that other functions such as polynomials or spline functions may be considered as well in the corrector part of the alignment position estimator as well. In an embodiment, the present invention provides in an initialisation process of a sensor that senses a property of a substrate as used in a lithographic process. Examples of such sensors include alignment sensors, level sensors and overlay sensors. In a level sensor, a height map of a substrate is generated by projecting a measurement beam at a slanted angle towards the substrate surface and determining a position of a reflected beam off of the surface. An overlay sensor is typically used as an off-line tool to assess the alignment of two consecutive layers of patterns on a substrate.

Each of these sensors can be configured to perform a plurality of measurements in order to arrive at a value for the property that is measured, i.e. the alignment mark position, the height level or the overlay value. Using the above described techniques, weight coefficients may be derives to weigh such a plurality of measurements, thereby arriving at an optimised value for the measurement property.

As such, the present invention may also be embodied as an alignment sensor, a level sensor or an overlay sensor, said sensors comprising, e.g. in a controller or control unit associated with the sensor, the weight coefficients as derived by the initialisation process.

In an embodiment, there is provide an initialization method for a sensor, the sensor being configured to perform a plurality of measurements of a property of an object using a respective plurality of different measurement parameters, different ones of the plurality of measurements using different measurement parameters, the method comprising: estimating a characteristic of the property based on the plurality of measurements, the characteristic comprising a combination of respective outcomes of respective ones of the plurality of measurements weighted by a respective weighting coefficient; using a plurality of models of the object, each respective one of the models being configured to enable a respective simulation of the performing of the plurality of measurements; performing, for each of respective one of the plurality of models, a respective simulation, the respective simulation including simulating the plurality of measurements under control of a respective plurality of different simulation parameters to obtain a respective plurality of simulated characteristics of the property, the plurality of different simulation parameters being indicative of the plurality of different measurement parameters; determining, for each respective one of the plurality of models, a respective bias representative of a respective difference between a respective theoretical characteristic of the property in accordance with the respective model and a respective further combination of the simulated characteristics of the property in the respective model; the respective further combination of the simulated characteristics comprising the plurality of weight coefficients, each particular one of the plurality of weight coefficients being associated with a particular one of the plurality of different simulation parameters; using a cost function configured to optimize a correspondence between the simulated characteristic of the property and the theoretical characteristic of the property; the cost function being a function of the respective biases of the plurality of models; optimizing the cost function, thereby deriving the plurality of the weight coefficients from the cost function; and using the weight coefficients and the associated simulation parameters in a controller associated with the sensor.

In an embodiment, the respective plurality of simulation parameters corresponds to the respective plurality of measurement parameters. In an embodiment, the respective simulation further includes determining a variance of the respective further combination of the respective plurality of the simulated characteristics of the respective model; the cost function further being a function of the variances. In an embodiment, the cost function comprises a sum of the biases. In an embodiment, the cost function comprises a sum of the variances. In an embodiment, optimizing the cost function comprises setting a derivative of the cost function with respect to the plurality of weight coefficients equal to zero. In an embodiment, the cost function has the form:

$$\sum_{t=1}^{T} (y_t - y_{training,t})^2 + \sigma_{y,t}^2$$

wherein $y_{training,t}$=theoretical characteristic of the property of model t of the plurality of T models;

$$\sum_{t=1}^{T} (y_t - y_{training,t})^2 = \sum_{t=1}^{T} (\underline{w}^\dagger \cdot \underline{x}_t - y_{training,t})^2$$

wherein $\underline{w}$=the plurality of weight coefficients, $\underline{x}_t$=the respective plurality of simulated characteristics as obtained for model t of the plurality of T models, $$\sigma_y^2 = \frac{\partial}{\partial \underline{x}} \cdot (\underline{w}^\dagger \cdot \underline{x}) \cdot \underline{\underline{C}}_x \cdot \left(\frac{\partial}{\partial \underline{x}} \cdot (\underline{w}^\dagger \cdot \underline{x})\right)^\dagger$$

$$= \underline{w}^\dagger \cdot \underline{\underline{C}}_x \cdot \underline{w}.$$

wherein $\underline{\underline{C}}_x$ = a covariance matrix of $\underline{x}_t$. In an embodiment, optimizing the cost function comprises solving:

$$\frac{\partial}{\partial \underline{w}} \cdot \left(\sum_{t=1}^{T} (y_t - y_{training,t})^2 + \sigma_{y,t}^2\right) = \underline{0}$$

In an embodiment, the characteristic as estimated further comprises a combination of basis functions weighted by a respective further weighting coefficient, the basis functions being a function of respective measurement biases of the plurality of measurements, a respective measurement bias of the plurality of measurements corresponding to a difference between a respective outcome of respective ones of the plurality of measurements and the combination of respective outcomes of respective ones of the plurality of measurements weighted by the respective weighting coefficient; and wherein the method further comprises: using, after the plurality of weight coefficients of the cost function has been determined, a further cost function, the further cost function comprising the cost function and a further combination of the basis functions weighted by the respective further weighting coefficients, whereby, in the further cost function, the basis functions are applied as a function of respective simulation biases, a respective simulation bias of the plurality of simulations corresponding to the difference between a respective simulation characteristic obtained from the simulation and the respective further combination of the simulated characteristics of the property in the respective model, weighted by the plurality of the weight coefficients. In an embodiment, the basis functions are radial basis functions. In an embodiment, the characteristic as estimated further comprises a combination of basis functions weighted by a respective further weighting coefficient, the basis functions being a function of pupil plane intensity measurements of the plurality of measurements; and the method further comprises: using, after the set of weight coefficients of the cost function has been determined, a further cost function, the further cost function comprising the cost function and a further combination of the basis functions, weighted by the respective further weighting coefficient, the basis functions being a function of pupil plane intensity simulations of the plurality of simulations. In an embodiment, the sensor is an alignment sensor, the property is a position of an alignment mark, the model comprising a portion of a stack of the substrate. In an embodiment, the sensor is an overlay sensor, the measured property being an overlay between a pair of marks in two consecutive layers of the substrate, the model comprising a portion of the stack of the substrate. In an embodiment, the sensor is a level sensor, the measured property being a height of the substrate at a predetermined position, the model comprising a portion of the stack of the substrate.

In an embodiment, there is provided an alignment sensor for a lithographic apparatus, the alignment sensor comprising an alignment projection system and an alignment detection system configured to perform alignment mark position measurements, the alignment projection system being configured to project a plurality of alignment beams having different alignment measurement parameters A onto a substrate, the alignment sensor further being initialized according to the initialization method as described herein.

In an embodiment, there is provided a lithographic apparatus comprising an alignment sensor as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An initialization method for a sensor, the sensor configured to perform a plurality of measurements of a property of an object using a respective plurality of different measurement parameters, different ones of the plurality of measurements using different measurement parameters, the method comprising:

estimating a characteristic of the property based on the plurality of measurements, the characteristic comprising a combination of respective outcomes of respective ones of the plurality of measurements weighted by a respective weighting coefficient;

using a plurality of models of the object, each respective one of the models configured to enable a respective simulation of the performing of the plurality of measurements;

performing, for each respective one of the plurality of models, a respective simulation, the respective simulation including simulating the plurality of measurements under control of a respective plurality of different simulation parameters to obtain a respective plurality of simulated characteristics of the property, the plurality of different simulation parameters being indicative of the plurality of different measurement parameters;

determining, for each respective one of the plurality of models, a respective bias representative of a respective difference between a respective theoretical characteristic of the property in accordance with the respective model and a respective further combination of the simulated characteristics of the property in the respective model, the respective further combination of the simulated characteristics comprising the plurality of weight coefficients, each particular one of the plurality of weight coefficients being associated with a particular one of the plurality of different simulation parameters;

using a cost function configured to optimize a correspondence between the simulated characteristic of the property and the theoretical characteristic of the property, the cost function being a function of the respective biases of the plurality of models;

optimizing the cost function to derive the plurality of weight coefficients from the cost function; and using the weight coefficients and the associated simulation parameters in a controller associated with the sensor.

2. The initialization method according to claim 1, wherein the respective plurality of simulation parameters corresponds to the respective plurality of measurement parameters.

3. The initialization method according to claim 1, wherein the respective simulation further includes determining a variance of the respective further combination of the respective plurality of the simulated characteristics of the respective model, the cost function further being a function of the variances.

4. The initialization method according to claim 3, wherein the cost function comprises a sum of the variances.

5. The initialization method according to claim 3, wherein the cost function has the form:

$$\sum_{t=1}^{T} (y_t - y_{training,t})^2 + \sigma_{y,t}^2$$

wherein:

$y_{training,t}$=theoretical characteristic of the property of model t of the plurality of T models;

$$\sum_{t=1}^{T} (y_t - y_{training,t})^2 = \sum_{t=1}^{T} (\underline{w}^\dagger \cdot \underline{x}_t - y_{training,t})^2$$

wherein:

$\underline{w}$=the plurality of weight coefficients $\underline{x}_t$=the respective plurality of simulated characteristics as obtained for model t of the plurality of T models;

$$\sigma_y^2 = \frac{\partial}{\partial \underline{x}} \cdot (\underline{w}^\dagger \cdot \underline{x}) \cdot \underline{\underline{C}}_{\underline{x}} \cdot \left(\frac{\partial}{\partial \underline{x}} \cdot (\underline{w}^\dagger \cdot \underline{x})\right)^\dagger$$
$$= \underline{w}^\dagger \cdot \underline{\underline{C}}_{\underline{x}} \cdot \underline{w}.$$

wherein $\underline{\underline{C}}_{\underline{x}}$=a covariance matrix of $x_t$.

6. The initialization method according to claim 5, wherein optimizing the cost function comprises solving:

$$\frac{\partial}{\partial \underline{w}} \cdot \left(\sum_{t=1}^{T} (y_t - y_{training,t})^2 + \sigma_{y,t}^2\right) = \underline{0}$$

7. The initialization method according to claim 5, wherein the basis functions are radial basis functions.

8. The initialization method according to claim 1, wherein the cost function comprises a sum of the biases.

9. The initialization method according to claim 1, wherein the optimizing the cost function comprises setting a derivative of the cost function with respect to the plurality of weight coefficients equal to zero.

10. The initialization method according to claim 1, wherein the characteristic as estimated further comprises a combination of basis functions weighted by a respective further weighting coefficient, the basis functions being a function of respective measurement biases of the plurality of measurements, a respective measurement bias of the plurality of measurements corresponding to a difference between a respective outcome of respective ones of the plurality of measurements and the combination of respective outcomes of respective ones of the plurality of measurements weighted by the respective weighting coefficient; and wherein the method further comprises using, after the plurality of weight coefficients of the cost function has been determined, a further cost function, the further cost function comprising the cost function and a further combination of the basis functions weighted by the respective further weighting coefficients, wherein, in the further cost function, the basis functions are applied as a function of respective simulation biases, a respective simulation bias of the plurality of simulations corresponding to the difference between a respective simulation characteristic obtained from the simulation and the respective further combination of the simulated characteristics of the property in the respective model, weighted by the plurality of the weight coefficients.

11. The initialization method according to claim 1, wherein the characteristic as estimated further comprises a combination of basis functions weighted by a respective further weighting coefficient, the basis functions being a function of pupil plane intensity measurements of the plurality of measurements; and wherein the method further comprises using, after the set of weight coefficients of the cost function has been determined, a further cost function, the further cost function comprising the cost function and a further combination of the basis functions, weighted by the respective further weighting coefficient, the basis functions being a function of pupil plane intensity simulations of the plurality of simulations.

12. The initialization method according to claim 1, wherein the sensor is an alignment sensor, the property being a position of an alignment mark, the model comprising a portion of a stack of the substrate.

13. The initialization method according to claim 1, wherein the sensor is an overlay sensor, the property being an overlay between a pair of marks in two consecutive layers of the substrate, the model comprising a portion of the stack of the substrate.

14. The initialization method according to claim 1, wherein the sensor is a level sensor, the property being a height of the substrate at a certain position, the model comprising a portion of the stack of the substrate.

15. An alignment sensor for a lithographic apparatus, the alignment sensor comprising an alignment projection system and an alignment detection system configured to perform alignment mark position measurements, the alignment projection system configured to project a plurality of alignment beams having different alignment measurement parameters onto a substrate, the alignment sensor further being initialized according to the initialization method according to claim 1.

16. A lithographic apparatus comprising the alignment sensor according to claim 15.

17. A non-transitory computer program product comprising machine readable instructions configured to cause a computer system to at least:

estimate a characteristic of a property of an object based on a plurality of measurements of the property of an object by a sensor using a respective plurality of different measurement parameters, different ones of the plurality of measurements using different measurement parameters, the characteristic comprising a combination of respective outcomes of respective ones of the plurality of measurements weighted by a respective weighting coefficient;

perform, for each respective one of a plurality of models of the object, each respective one of the models configured to enable respective simulation of the performing of the plurality of measurements, a respective simulation, the respective simulation including simulating the plurality of measurements under control of a respective plurality of different simulation parameters to obtain a respective plurality of simulated characteristics of the property, the plurality of different simulation parameters being indicative of the plurality of different measurement parameters;

determine, for each respective one of the plurality of models, a respective bias representative of a respective difference between a respective theoretical characteristic of the property in accordance with the respective model and a respective further combination of the simulated characteristics of the property in the respective model, the respective further combination of the simulated characteristics comprising the plurality of weight coefficients, each particular one of the plurality of weight coefficients being associated with a particular one of the plurality of different simulation parameters;

use a cost function configured to optimize a correspondence between the simulated characteristic of the property and the theoretical characteristic of the property, the cost function being a function of the respective biases of the plurality of models;

optimize the cost function to derive the plurality of the weight coefficients from the cost function; and generate electronic data, based on the weight coefficients and the associated simulation parameters, to be used by a controller associated with the sensor.

18. The computer program product according to claim 17, wherein the respective plurality of simulation parameters corresponds to the respective plurality of measurement parameters.

19. The computer program product according to claim 17, wherein the respective simulation further includes determining a variance of the respective further combination of the respective plurality of the simulated characteristics of the respective model, the cost function further being a function of the variances.

20. The computer program product according to claim 17, wherein the cost function comprises a sum of the biases.

* * * * *